US010023959B2

(12) United States Patent
Sung et al.

(10) Patent No.: US 10,023,959 B2
(45) Date of Patent: Jul. 17, 2018

(54) ANTI-TRANSIENT SHOWERHEAD

(71) Applicant: Lam Research Corporation, Fremont, CA (US)

(72) Inventors: Edward Sung, Milpitas, CA (US); Colin F. Smith, Half Moon Bay, CA (US); Shawn M. Hamilton, Boulder Creek, CA (US)

(73) Assignee: Lam Research Corporation, Fremont, CA (US)

( * ) Notice: Subject to any disclaimer, the term of this patent is extended or adjusted under 35 U.S.C. 154(b) by 207 days.

(21) Appl. No.: 15/163,594

(22) Filed: May 24, 2016

(65) Prior Publication Data

US 2016/0348242 A1    Dec. 1, 2016

Related U.S. Application Data

(60) Provisional application No. 62/166,612, filed on May 26, 2015.

(51) Int. Cl.
*C23C 16/455*    (2006.01)

(52) U.S. Cl.
CPC .. *C23C 16/45574* (2013.01); *C23C 16/45565* (2013.01)

(58) Field of Classification Search
None
See application file for complete search history.

(56) References Cited

U.S. PATENT DOCUMENTS

| 3,215,508 A | 11/1965 | Piester |
| 4,315,173 A | 2/1982 | Calfo et al. |
| 4,577,203 A | 3/1986 | Kawamura |
| 4,647,512 A | 3/1987 | Venkataramanan et al. |
| 4,671,204 A | 6/1987 | Ballou |
| 4,890,780 A | 1/1990 | Mimata et al. |
| 4,960,488 A | 10/1990 | Law et al. |
| 4,993,485 A | 2/1991 | Gorman |
| 5,106,453 A | 4/1992 | Benko et al. |
| 5,186,756 A | 2/1993 | Benko et al. |
| 5,212,116 A | 5/1993 | Yu |
| 5,213,650 A | 5/1993 | Wang et al. |
| 5,223,001 A | 6/1993 | Saeki |
| 5,232,508 A | 8/1993 | Arena et al. |
| 5,268,034 A | 12/1993 | Vukelic |
| 5,286,519 A | 2/1994 | Vukelic |

(Continued)

FOREIGN PATENT DOCUMENTS

| CN | 1574229 A | 2/2005 |
| CN | 1802722 A | 7/2006 |

(Continued)

OTHER PUBLICATIONS

U.S. Office Action dated Dec. 3, 2015 issued in U.S. Appl. No. 13/842,054.

(Continued)

*Primary Examiner* — Jethro M Pence
(74) *Attorney, Agent, or Firm* — Weaver Austin Villeneuve & Sampson LLP

(57) ABSTRACT

Showerheads for semiconductor processing equipment are disclosed that include various features designed to minimize or eliminate non-uniform gas delivery across the surface of a wafer due to gas flow transients within the showerhead.

26 Claims, 11 Drawing Sheets

(56) References Cited

U.S. PATENT DOCUMENTS

| | | |
|---|---|---|
| 5,314,574 A | 5/1994 | Takahashi |
| 5,366,557 A | 11/1994 | Yu |
| 5,376,213 A | 12/1994 | Ueda et al. |
| 5,446,824 A | 8/1995 | Moslehi |
| 5,452,396 A | 9/1995 | Sopori |
| 5,453,124 A | 9/1995 | Moslehi et al. |
| 5,468,298 A | 11/1995 | Lei et al. |
| 5,534,073 A | 7/1996 | Kinoshita et al. |
| 5,578,132 A | 11/1996 | Yamaga et al. |
| 5,581,874 A | 12/1996 | Aoki et al. |
| 5,597,439 A | 1/1997 | Salzman |
| 5,614,026 A | 3/1997 | Williams |
| 5,622,606 A | 4/1997 | Kugler et al. |
| 5,643,394 A | 7/1997 | Maydan et al. |
| 5,653,479 A | 8/1997 | Henderson |
| 5,670,218 A | 9/1997 | Back |
| 5,681,614 A | 10/1997 | Omori et al. |
| 5,728,425 A | 3/1998 | Ebe et al. |
| 5,730,801 A | 3/1998 | Tepman et al. |
| 5,741,363 A | 4/1998 | Van Buskirk et al. |
| 5,766,364 A | 6/1998 | Ishida et al. |
| 5,789,322 A | 8/1998 | Brown et al. |
| 5,806,980 A | 9/1998 | Berrian |
| 5,834,068 A | 11/1998 | Chern et al. |
| 5,855,465 A | 1/1999 | Boitnott et al. |
| 5,871,586 A | 2/1999 | Crawley et al. |
| 5,882,411 A | 3/1999 | Zhao et al. |
| 5,883,017 A | 3/1999 | Tepman et al. |
| 5,884,009 A | 3/1999 | Okase |
| 5,891,251 A | 4/1999 | MacLeish et al. |
| 5,919,382 A | 7/1999 | Qian et al. |
| 5,948,704 A | 9/1999 | Benjamin et al. |
| 5,950,925 A | 9/1999 | Fukunaga et al. |
| 5,958,140 A | 9/1999 | Arami et al. |
| 5,992,453 A | 11/1999 | Zimmer |
| 6,010,748 A | 1/2000 | Van Buskirk et al. |
| 6,013,155 A | 1/2000 | McMillin et al. |
| 6,022,413 A | 2/2000 | Shinozaki et al. |
| 6,022,586 A | 2/2000 | Hashimoto et al. |
| 6,025,013 A | 2/2000 | Heming et al. |
| 6,030,881 A | 2/2000 | Papasouliotis et al. |
| 6,036,878 A | 3/2000 | Collins |
| 6,054,013 A | 4/2000 | Collins et al. |
| 6,059,885 A | 5/2000 | Ohashi et al. |
| 6,089,472 A | 7/2000 | Carter |
| 6,095,085 A | 8/2000 | Agarwal |
| 6,112,697 A | 9/2000 | Sharan et al. |
| 6,132,814 A | 10/2000 | Livesay et al. |
| 6,148,761 A | 11/2000 | Majewski et al. |
| 6,190,732 B1 | 2/2001 | Omstead et al. |
| 6,191,011 B1 | 2/2001 | Gilboa et al. |
| 6,200,412 B1 | 3/2001 | Kilgore et al. |
| 6,237,528 B1 | 5/2001 | Szapucki et al. |
| 6,241,825 B1 | 6/2001 | Wytman |
| 6,245,149 B1 | 6/2001 | de Lomenie et al. |
| 6,245,192 B1 | 6/2001 | Dhindsa et al. |
| 6,251,188 B1 | 6/2001 | Hashimoto et al. |
| 6,289,842 B1 | 9/2001 | Tompa |
| 6,291,793 B1 | 9/2001 | Qian et al. |
| 6,306,247 B1 | 10/2001 | Lin |
| 6,316,063 B1 | 11/2001 | Andideh et al. |
| 6,335,261 B1 | 1/2002 | Natzle et al. |
| 6,338,626 B1 | 1/2002 | Saeki |
| 6,352,943 B2 | 3/2002 | Maeda et al. |
| 6,352,953 B1 | 3/2002 | Seki et al. |
| 6,364,949 B1 | 4/2002 | Or et al. |
| 6,379,056 B1 | 4/2002 | Ueda |
| 6,387,182 B1 | 5/2002 | Horie et al. |
| 6,387,207 B1 | 5/2002 | Janakiraman et al. |
| 6,409,837 B1 | 6/2002 | Hillman |
| 6,415,736 B1 | 7/2002 | Hao et al. |
| 6,444,039 B1 | 9/2002 | Nguyen |
| 6,453,992 B1 | 9/2002 | Kim |
| 6,455,098 B2 | 9/2002 | Tran et al. |
| 6,477,980 B1 | 11/2002 | White et al. |
| 6,499,425 B1 | 12/2002 | Sandhu et al. |
| 6,502,530 B1 | 1/2003 | Turlot et al. |
| 6,503,330 B1 | 1/2003 | Sneh et al. |
| 6,511,539 B1 | 1/2003 | Raaijmakers |
| 6,534,395 B2 | 3/2003 | Werkhoven et al. |
| 6,534,802 B1 | 3/2003 | Schuegraf |
| 6,537,420 B2 | 3/2003 | Rose |
| 6,540,838 B2 | 4/2003 | Sneh et al. |
| 6,551,339 B2 | 4/2003 | Gavronsky |
| 6,551,399 B1 | 4/2003 | Sneh et al. |
| 6,565,661 B1 | 5/2003 | Nguyen |
| 6,586,349 B1 | 7/2003 | Jeon et al. |
| 6,626,718 B2 | 9/2003 | Hiroki |
| 6,635,117 B1 | 10/2003 | Kinnard et al. |
| 6,663,714 B2 | 12/2003 | Mizuno et al. |
| 6,716,287 B1 | 4/2004 | Santiago et al. |
| 6,726,520 B2 | 4/2004 | Takeda et al. |
| 6,727,654 B2 | 4/2004 | Ogawa et al. |
| 6,793,733 B2 | 6/2004 | Janakiraman et al. |
| 6,782,843 B2 | 8/2004 | Kinnard et al. |
| 6,821,180 B2 | 11/2004 | Kimura et al. |
| 6,821,347 B2 | 11/2004 | Carpenter et al. |
| 6,835,417 B2 | 12/2004 | Saenger et al. |
| 6,848,961 B2 | 2/2005 | Nomura et al. |
| 6,867,152 B1 | 3/2005 | Hausmann et al. |
| 6,867,309 B2 | 3/2005 | Chen et al. |
| 6,883,733 B1 | 4/2005 | Lind |
| 6,884,738 B2 | 4/2005 | Asai et al. |
| 6,921,456 B2 | 7/2005 | Biberger et al. |
| 6,921,556 B2 | 7/2005 | Shimizu et al. |
| 6,958,301 B2 | 10/2005 | Kim et al. |
| 6,972,203 B2 | 12/2005 | Azuma |
| 6,983,892 B2 | 1/2006 | Noorbakhsh et al. |
| 7,077,917 B2 | 7/2006 | Jones |
| 7,097,878 B1 | 8/2006 | Rulkens et al. |
| 7,109,129 B1 | 9/2006 | Papasouliotis |
| 7,129,189 B1 | 10/2006 | Hausmann et al. |
| 7,135,418 B1 | 11/2006 | Papasouliotis |
| 7,148,155 B1 | 12/2006 | Tarafdar et al. |
| 7,151,005 B2 | 12/2006 | Azuma |
| 7,189,427 B2 | 3/2007 | Takeda et al. |
| 7,225,820 B2 | 6/2007 | Jones |
| 7,235,459 B2 | 6/2007 | Sandhu |
| 7,255,772 B2 | 8/2007 | Biberger et al. |
| 7,296,534 B2 | 11/2007 | Fink |
| 7,326,097 B2 | 2/2008 | Nomura et al. |
| 7,381,578 B2 | 6/2008 | Azuma |
| 7,422,636 B2 | 9/2008 | Ishizaka |
| 7,479,303 B2 | 1/2009 | Byun |
| 7,481,882 B2 | 1/2009 | Won et al. |
| 7,491,036 B2 | 2/2009 | Parent et al. |
| 7,511,425 B2 | 3/2009 | Tsuda et al. |
| D593,640 S | 6/2009 | Schoenherr et al. |
| 7,670,432 B2 | 3/2010 | Li |
| 7,712,434 B2 | 5/2010 | Dhindsa et al. |
| 7,737,035 B1 | 6/2010 | Lind et al. |
| 7,790,633 B1 | 9/2010 | Tarafdar et al. |
| 7,846,291 B2 | 12/2010 | Otsuki |
| 7,931,749 B2 | 4/2011 | Amikura et al. |
| 7,976,631 B2 | 7/2011 | Burrows et al. |
| 7,993,457 B1 | 8/2011 | Krotov et al. |
| 8,083,853 B2 | 12/2011 | Choi et al. |
| 8,137,467 B2 | 3/2012 | Meinhold et al. |
| 8,187,679 B2 | 5/2012 | Dickey et al. |
| 8,231,799 B2 | 7/2012 | Bera et al. |
| 8,298,370 B2 | 10/2012 | Byun |
| 8,308,865 B2 | 11/2012 | Kim et al. |
| 8,328,939 B2 | 12/2012 | Choi et al. |
| 8,361,275 B2 | 1/2013 | Tahara et al. |
| 8,361,892 B2 | 1/2013 | Tam et al. |
| 8,419,959 B2 | 4/2013 | Bettencourt et al. |
| 8,443,756 B2 | 5/2013 | Fischer et al. |
| 8,512,509 B2 | 8/2013 | Bera et al. |
| 8,673,080 B2 | 3/2014 | Meinhold et al. |
| 8,679,956 B2 | 3/2014 | Tam et al. |
| 8,721,791 B2 | 5/2014 | Tiner et al. |
| 8,728,956 B2 | 5/2014 | LaVoie et al. |
| 8,764,902 B2 | 7/2014 | Suzuki et al. |
| 8,869,742 B2 | 10/2014 | Dhindsa et al. |

(56) References Cited

U.S. PATENT DOCUMENTS

| | | | |
|---|---|---|---|
| 8,882,913 B2 | 11/2014 | Byun et al. |
| 9,017,481 B1 | 3/2015 | Pettinger et al. |
| 9,034,142 B2 | 5/2015 | Bartlett et al. |
| 9,057,128 B2 | 6/2015 | Olgado |
| 9,314,854 B2 | 4/2016 | Huang et al. |
| 9,315,897 B2 | 4/2016 | Byun et al. |
| 9,349,619 B2 | 5/2016 | Kawamata et al. |
| 9,353,439 B2 | 5/2016 | Kashyap et al. |
| 9,441,296 B2 | 9/2016 | Sabri et al. |
| 9,441,791 B2 | 9/2016 | Mizusawa et al. |
| 9,447,499 B2 | 9/2016 | Roy et al. |
| 9,476,120 B2 | 10/2016 | Meinhold et al. |
| 9,476,121 B2 | 10/2016 | Byun et al. |
| 9,677,176 B2 | 6/2017 | Chandrasekharan et al. |
| 2001/0002280 A1 | 5/2001 | Sneh |
| 2001/0027026 A1 | 10/2001 | Dhindsa et al. |
| 2001/0035127 A1 | 11/2001 | Metzner et al. |
| 2001/0036682 A1 | 11/2001 | Takeda et al. |
| 2001/0042514 A1 | 11/2001 | Mizuno et al. |
| 2002/0009944 A1 | 1/2002 | Ouchi |
| 2002/0017243 A1 | 2/2002 | Pyo |
| 2002/0059904 A1 | 5/2002 | Doppelhammer |
| 2002/0069969 A1 | 6/2002 | Rose |
| 2002/0100418 A1 | 8/2002 | Sandhu et al. |
| 2002/0123230 A1 | 9/2002 | Hubacek |
| 2002/0127436 A1 | 9/2002 | Shibamoto et al. |
| 2002/0134507 A1 | 9/2002 | DeDontney et al. |
| 2002/0139302 A1 | 10/2002 | Nagashima |
| 2002/0144783 A1 | 10/2002 | Tran et al. |
| 2002/0144785 A1 | 10/2002 | Srivastava et al. |
| 2002/0157960 A1 | 10/2002 | Dordi et al. |
| 2002/0195683 A1 | 12/2002 | Kim et al. |
| 2003/0008602 A1 | 1/2003 | Ashjaee et al. |
| 2003/0010451 A1 | 1/2003 | Tzu et al. |
| 2003/0010452 A1 | 1/2003 | Park et al. |
| 2003/0015764 A1 | 1/2003 | Raaijmakers et al. |
| 2003/0023338 A1 | 1/2003 | Chin et al. |
| 2003/0031807 A1 | 2/2003 | Elers et al. |
| 2003/0051665 A1* | 3/2003 | Zhao | C23C 16/45565 118/723 E |
| 2003/0054099 A1* | 3/2003 | Jurgensen | C23C 14/0015 427/248.1 |
| 2003/0059535 A1 | 3/2003 | Luo et al. |
| 2003/0066607 A1 | 4/2003 | White et al. |
| 2003/0106490 A1 | 6/2003 | Jallepally et al. |
| 2003/0109094 A1 | 6/2003 | Seidel et al. |
| 2003/0121537 A1 | 7/2003 | Dunn |
| 2003/0134038 A1 | 7/2003 | Paranjpe |
| 2003/0168001 A1 | 9/2003 | Sneh |
| 2003/0170388 A1 | 9/2003 | Shinriki et al. |
| 2003/0185977 A1 | 10/2003 | Kalynushkin et al. |
| 2003/0207032 A1 | 11/2003 | Ahn et al. |
| 2003/0209324 A1 | 11/2003 | Fink |
| 2003/0232512 A1 | 12/2003 | Dickinson et al. |
| 2004/0003777 A1 | 1/2004 | Carpenter et al. |
| 2004/0004247 A1 | 1/2004 | Forbes et al. |
| 2004/0033662 A1 | 2/2004 | Lee et al. |
| 2004/0043149 A1 | 3/2004 | Gordon et al. |
| 2004/0044127 A1 | 3/2004 | Okubo et al. |
| 2004/0050325 A1 | 3/2004 | Samoilov et al. |
| 2004/0050326 A1 | 3/2004 | Thilderkvist et al. |
| 2004/0050496 A1 | 3/2004 | Iwai et al. |
| 2004/0102031 A1 | 5/2004 | Kloster et al. |
| 2004/0134611 A1 | 7/2004 | Kato et al. |
| 2004/0149215 A1 | 8/2004 | Shao et al. |
| 2004/0200412 A1 | 10/2004 | Frijlink |
| 2004/0203254 A1 | 10/2004 | Conley et al. |
| 2004/0206267 A1 | 10/2004 | Sambasivan et al. |
| 2004/0216844 A1 | 11/2004 | Janakiraman et al. |
| 2004/0224496 A1 | 11/2004 | Cui et al. |
| 2004/0226507 A1 | 11/2004 | Carpenter et al. |
| 2004/0235299 A1 | 11/2004 | Srivastava et al. |
| 2005/0000423 A1 | 1/2005 | Kasai et al. |
| 2005/0000430 A1 | 1/2005 | Jang et al. |
| 2005/0000442 A1 | 1/2005 | Hayashi et al. |
| 2005/0017100 A1 | 1/2005 | Watanabe et al. |
| 2005/0022748 A1 | 2/2005 | Gabriel et al. |
| 2005/0054213 A1 | 3/2005 | Derderian et al. |
| 2005/0092248 A1 | 5/2005 | Lee et al. |
| 2005/0112282 A1 | 5/2005 | Gordon et al. |
| 2005/0173404 A1 | 8/2005 | Benjamin et al. |
| 2005/0178336 A1 | 8/2005 | Liu |
| 2005/0181617 A1 | 8/2005 | Bosch |
| 2005/0191803 A1 | 9/2005 | Matsuse et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0241579 A1 | 11/2005 | Kidd |
| 2005/0241765 A1 | 11/2005 | Dhindsa et al. |
| 2005/0241766 A1 | 11/2005 | Dhindsa et al. |
| 2005/0241767 A1 | 11/2005 | Ferris et al. |
| 2005/0242061 A1 | 11/2005 | Fukuda |
| 2005/0260357 A1 | 11/2005 | Olsen et al. |
| 2005/0268856 A1 | 12/2005 | Miller et al. |
| 2005/0269030 A1 | 12/2005 | Kent et al. |
| 2006/0021703 A1 | 2/2006 | Umotoy et al. |
| 2006/0027611 A1 | 2/2006 | Hobbs |
| 2006/0038293 A1 | 2/2006 | Rueger et al. |
| 2006/0046470 A1 | 3/2006 | Becknell et al. |
| 2006/0102283 A1 | 5/2006 | Kwon et al. |
| 2006/0112876 A1 | 6/2006 | Choi et al. |
| 2006/0137607 A1 | 6/2006 | Seo et al. |
| 2006/0191637 A1 | 8/2006 | Zajac et al. |
| 2006/0213439 A1 | 9/2006 | Ishizaka |
| 2006/0228496 A1 | 10/2006 | Choi et al. |
| 2006/0263522 A1 | 11/2006 | Byun |
| 2007/0068798 A1 | 3/2007 | Honda et al. |
| 2007/0110918 A1 | 5/2007 | Yuda et al. |
| 2007/0116872 A1 | 5/2007 | Li et al. |
| 2007/0116873 A1 | 5/2007 | Li et al. |
| 2007/0157683 A1 | 7/2007 | Li |
| 2007/0163440 A1 | 7/2007 | Kim et al. |
| 2007/0193515 A1 | 8/2007 | Jeon et al. |
| 2007/0209588 A1 | 9/2007 | Li |
| 2007/0209590 A1 | 9/2007 | Li |
| 2007/0215048 A1 | 9/2007 | Suzuki et al. |
| 2007/0246163 A1 | 10/2007 | Paterson et al. |
| 2007/0248515 A1 | 10/2007 | Tompa et al. |
| 2007/0264427 A1 | 11/2007 | Shinriki et al. |
| 2007/0272154 A1 | 11/2007 | Amikura et al. |
| 2007/0275569 A1 | 11/2007 | Moghadam et al. |
| 2008/0006208 A1 | 1/2008 | Ueno et al. |
| 2008/0017315 A1 | 1/2008 | Fukuchi |
| 2008/0020146 A1 | 1/2008 | Choi et al. |
| 2008/0053614 A1 | 3/2008 | Sago et al. |
| 2008/0081114 A1 | 4/2008 | Johanson et al. |
| 2008/0093341 A1 | 4/2008 | Turlot et al. |
| 2008/0141941 A1 | 6/2008 | Augustino et al. |
| 2008/0156264 A1 | 7/2008 | Fair et al. |
| 2008/0156631 A1 | 7/2008 | Fair et al. |
| 2008/0241379 A1 | 10/2008 | Suzuki et al. |
| 2008/0241517 A1 | 10/2008 | Kenworthy et al. |
| 2008/0242085 A1 | 10/2008 | Fischer et al. |
| 2008/0308228 A1 | 12/2008 | Stevenson et al. |
| 2009/0000743 A1 | 1/2009 | Iizuka |
| 2009/0017227 A1 | 1/2009 | Fu et al. |
| 2009/0081878 A1 | 3/2009 | Dhindsa |
| 2009/0095218 A1 | 4/2009 | Meinhold et al. |
| 2009/0095219 A1 | 4/2009 | Meinhold et al. |
| 2009/0095220 A1 | 4/2009 | Meinhold et al. |
| 2009/0095222 A1 | 4/2009 | Tam et al. |
| 2009/0095621 A1 | 4/2009 | Kao et al. |
| 2009/0098276 A1 | 4/2009 | Burrows et al. |
| 2009/0169744 A1 | 7/2009 | Byun et al. |
| 2009/0178615 A1 | 7/2009 | Kim et al. |
| 2009/0202721 A1 | 8/2009 | Nogami et al. |
| 2009/0211085 A1 | 8/2009 | Kennedy et al. |
| 2009/0223449 A1 | 9/2009 | Ishida |
| 2009/0236313 A1 | 9/2009 | Qiu et al. |
| 2009/0260571 A1 | 10/2009 | Ostrowski et al. |
| 2009/0266911 A1 | 10/2009 | Kim et al. |
| 2009/0305509 A1 | 12/2009 | Stevenson et al. |
| 2009/0320756 A1 | 12/2009 | Tanaka |

(56) References Cited

U.S. PATENT DOCUMENTS

| | | |
|---|---|---|
| 2010/0003405 A1 | 1/2010 | Kappeler |
| 2010/0003406 A1 | 1/2010 | Lam et al. |
| 2010/0173074 A1 | 7/2010 | Juarez et al. |
| 2010/0184298 A1 | 7/2010 | Dhindsa |
| 2010/0206376 A1 | 8/2010 | You et al. |
| 2010/0263588 A1 | 10/2010 | Zhiyin |
| 2010/0272895 A1 | 10/2010 | Tsuda |
| 2010/0279008 A1 | 11/2010 | Takagi |
| 2010/0288439 A1 | 11/2010 | Ishibashi et al. |
| 2010/0300359 A1 | 12/2010 | Armour et al. |
| 2011/0011338 A1 | 1/2011 | Chuc et al. |
| 2011/0023782 A1 | 2/2011 | Han |
| 2011/0048325 A1 | 3/2011 | Choi et al. |
| 2011/0048642 A1 | 3/2011 | Mihara et al. |
| 2011/0052833 A1 | 3/2011 | Hanawa et al. |
| 2011/0065276 A1 | 3/2011 | Ganguly et al. |
| 2011/0073038 A1 | 3/2011 | Chien et al. |
| 2011/0076401 A1 | 3/2011 | Chao et al. |
| 2011/0088847 A1 | 4/2011 | Law et al. |
| 2011/0146571 A1 | 6/2011 | Bartlett et al. |
| 2011/0159690 A1 | 6/2011 | Chandrashekar et al. |
| 2011/0253044 A1 | 10/2011 | Tam et al. |
| 2011/0256315 A1 | 10/2011 | Tam et al. |
| 2011/0256692 A1 | 10/2011 | Tam et al. |
| 2011/0256726 A1 | 10/2011 | LaVoie et al. |
| 2011/0300716 A1 | 12/2011 | Park et al. |
| 2011/0308551 A1 | 12/2011 | Chung et al. |
| 2012/0052216 A1 | 3/2012 | Hanawa et al. |
| 2012/0077349 A1 | 3/2012 | Li et al. |
| 2012/0090691 A1 | 4/2012 | Baluja et al. |
| 2012/0135609 A1 | 5/2012 | Yudovsky et al. |
| 2012/0156877 A1 | 6/2012 | Yap et al. |
| 2012/0156880 A1 | 6/2012 | Panagopoulos |
| 2012/0161405 A1 | 6/2012 | Mohn et al. |
| 2012/0222815 A1 | 9/2012 | Sabri et al. |
| 2012/0227665 A1 | 9/2012 | Ozgun et al. |
| 2012/0264051 A1 | 10/2012 | Angelov et al. |
| 2012/0269968 A1* | 10/2012 | Rayner, Jr. ............ C23C 16/452 427/255.26 |
| 2012/0305190 A1 | 12/2012 | Kang et al. |
| 2012/0309204 A1 | 12/2012 | Kang et al. |
| 2013/0052804 A1 | 2/2013 | Song |
| 2013/0109159 A1 | 5/2013 | Carlson |
| 2013/0220975 A1 | 8/2013 | Dhindsa |
| 2013/0288485 A1 | 10/2013 | Liang et al. |
| 2013/0299605 A1 | 11/2013 | Ehrlich et al. |
| 2013/0341433 A1 | 12/2013 | Roy et al. |
| 2014/0061324 A1 | 3/2014 | Mohn et al. |
| 2014/0103145 A1 | 4/2014 | White et al. |
| 2014/0103806 A1 | 4/2014 | Kellogg et al. |
| 2014/0158792 A1 | 6/2014 | Meinhold et al. |
| 2014/0179114 A1 | 6/2014 | van Schravendijk |
| 2014/0235069 A1 | 8/2014 | Breiling et al. |
| 2014/0238608 A1 | 8/2014 | Sabri et al. |
| 2014/0272185 A1 | 9/2014 | Na et al. |
| 2014/0299681 A1 | 10/2014 | Kashyap et al. |
| 2014/0306027 A1 | 10/2014 | Xu et al. |
| 2015/0004798 A1 | 1/2015 | Chandrasekharan |
| 2015/0007770 A1 | 1/2015 | Chandrasekharan et al. |
| 2015/0007771 A1 | 1/2015 | Silva et al. |
| 2015/0011095 A1 | 1/2015 | Chandrasekharan et al. |
| 2015/0011096 A1 | 1/2015 | Chandrasekharan et al. |
| 2015/0167168 A1 | 6/2015 | Keshavamurthy et al. |
| 2015/0187568 A1 | 7/2015 | Pettinger et al. |
| 2015/0218701 A1 | 8/2015 | Bartlett et al. |
| 2015/0315706 A1 | 11/2015 | Chandrasekharan et al. |
| 2015/0377481 A1* | 12/2015 | Smith ................ F22B 1/28 392/396 |
| 2016/0340782 A1 | 11/2016 | Chandrasekharan et al. |
| 2016/0343595 A1 | 11/2016 | Lind et al. |
| 2016/0348244 A1 | 12/2016 | Sabri et al. |
| 2017/0009344 A1 | 1/2017 | Meinhold et al. |

FOREIGN PATENT DOCUMENTS

| | | |
|---|---|---|
| CN | 101405433 A | 4/2009 |
| CN | 101423936 A | 5/2009 |
| CN | 101423937 A | 5/2009 |
| CN | 101448977 A | 6/2009 |
| CN | 201343570 Y | 11/2009 |
| CN | 102102194 A | 6/2011 |
| CN | 102132383 A | 7/2011 |
| CN | 102424956 A | 4/2012 |
| EP | 0 462 730 A1 | 12/1991 |
| JP | H05-186292 A | 7/1993 |
| JP | 05-308071 | 11/1993 |
| JP | 07-045542 | 2/1995 |
| JP | H08239775 A | 9/1996 |
| JP | 2002-030445 A | 1/2002 |
| JP | 2002-033311 A | 1/2002 |
| JP | 2004-256479 | 9/2004 |
| JP | 2006-261217 A | 9/2006 |
| JP | 3147392 | 12/2008 |
| JP | 2010-84190 A | 4/2010 |
| JP | 5468735 B2 | 4/2014 |
| KR | 20-0454281 | 6/2011 |
| SG | 152163 | 5/2011 |
| TW | 300319 B | 3/1997 |
| TW | 490705 B | 6/2002 |
| TW | 492045 B | 6/2002 |
| TW | 200610033 A | 3/2006 |
| TW | 200710928 A | 3/2007 |
| TW | 200923126 | 6/2009 |
| TW | 200924049 A | 6/2009 |
| TW | M361710 | 7/2009 |
| TW | 201132793 | 10/2011 |
| TW | 201229300 A | 7/2012 |
| WO | WO 00/42236 A2 | 7/2000 |
| WO | WO 02/27063 | 4/2002 |
| WO | WO 03/83167 | 10/2003 |
| WO | WO 2004/107413 A2 | 12/2004 |
| WO | WO 2005/103323 A1 | 11/2005 |
| WO | WO 2006/022997 A2 | 3/2006 |
| WO | WO 2007/060143 A1 | 5/2007 |
| WO | WO 2007/142690 A2 | 12/2007 |
| WO | WO 2008/042032 | 4/2008 |
| WO | WO 2011/011532 | 1/2011 |
| WO | WO 2011/044451 A2 | 4/2011 |
| WO | WO 2012/122054 | 9/2012 |

OTHER PUBLICATIONS

U.S. Final Office Action dated May 18, 2016 issued in U.S. Appl. No. 13/842,054.

U.S. Office Action dated Sep. 8, 2016 issued in U.S. Appl. No. 13/842,054.

U.S. Office Action dated Apr. 12, 2017 issued in U.S. Appl. No. 13/842,054.

U.S. Office Action dated Oct. 20, 2017 issued in U.S. Appl. No. 13/842,054.

U.S. Office Action dated Oct. 12, 2016 issued in U.S. Appl. No. 13/934,620.

U.S. Final Office Action dated Jun. 22, 2017 issued in U.S. Appl. No. 13/934,620.

U.S. Office Action dated Apr. 7, 2016 issued in U.S. Appl. No. 13/934,597.

U.S. Final Office Action dated Sep. 16, 2016 issued in U.S. Appl. No. 13/934,597.

U.S. Notice of Allowance dated Jan. 10, 2017 issued in U.S. Appl. No. 13/934,597.

U.S. Notice of Allowance dated Apr. 14, 2017 issued in U.S. Appl. No. 13/934,597.

U.S. Office Action dated Mar. 13, 2015 issued in U.S. Appl. No. 13/531,254.

U.S. Office Action dated Sep. 17, 2015 issued in U.S. Appl. No. 13/531,254.

U.S. Notice of Allowance dated Jan. 15, 2016 issued in U.S. Appl. No. 13/531,254.

(56) References Cited

OTHER PUBLICATIONS

U.S. Notice of Allowance dated May 12, 2016 issued in U.S. Appl. No. 13/531,254.
U.S. Office Action dated Nov. 20, 2017 issued in U.S. Appl. No. 13/934,620.
Taiwan Examination and Search Report dated Apr. 11, 2017 issued in Application No. TW 102147584.
Chinese First Office Action dated Dec. 9, 2015 issued in Application No. CN 201410052998.X.
Chinese Second Office Action dated Jul. 27, 2016 issued in Application No. CN 201410052998.X.
Chinese Third Office Action dated Mar. 2, 2017 issued in Application No. CN 201410052998.X.
Singapore Search Report and Written Opinion dated Jul. 7, 2015 issued in Application No. SG 201401171-2.
Singapore Final Examination Report dated Jan. 12, 2016 issued in Application No. SG 201401171-2.
Taiwan Examination and Search Report dated May 12, 2017 issued in Application No. TW 103104956.
Chinese First Office Action dated Mar. 2, 2016 issued in Application No. CN 201410312720.1.
Taiwan Examination and Search Report dated Oct. 13, 2016 issued in Application No. TW 102122169.
Chinese Fourth Office Action dated Sep. 13, 2017 issued in Application No. CN 201410052998.X.
Japanese First Office Action dated Nov. 7, 2017 issued in Application No. JP 2014-021856.
U.S. Office Action, dated Jul. 27, 2017, issued in U.S. Appl. No. 14/668,511.
U.S. Applicant Initiated Interview Summary, dated Nov. 1, 2017, issued in U.S. Appl. No. 14/668,511.
U.S. Final Office Action, dated Feb. 7, 2018, issued in U.S. Appl. No. 14/668,511.
U.S. Office Action, dated Sep. 14, 2017, issued in U.S. Appl. No. 14/716,823.
U.S. Office Action, dated Sep. 17, 2010, issued in U.S. Appl. No. 11/974,966.
U.S. Final Office Action, dated Mar. 21, 2011, issued in U.S. Appl. No. 11/974,966.
U.S. Office Action, dated Sep. 2, 2011, issued in U.S. Appl. No. 11/974,966.
U.S. Notice of Allowance, dated Jan. 6, 2012, issued in U.S. Appl. No. 11/974,966.
U.S. Office Action, dated Sep. 17, 2010, issued in U.S. Appl. No. 12/181,927.
U.S. Final Office Action, dated Mar. 28, 2011, issued in U.S. Appl. No. 12/181,927.
U.S. Examiner's Answer, dated Dec. 21, 2011, issued in U.S. Appl. No. 12/181,927.
U.S. Patent Board Decision on Appeal dated Aug. 19, 2013 issued in U.S. Appl. No. 12/181,927.
U.S. Notice of Allowance, dated Oct. 25, 2013, issued in U.S. Appl. No. 12/181,927.
U.S. Office Action, dated Mar. 11, 2016, issued in U.S. Appl. No. 14/169,325.
U.S. Notice of Allowance, dated Jun. 22, 2016, issued in U.S. Appl. No. 14/169,325.
U.S. Miscellaneous Communication, dated Jul. 11, 2016, issued in U.S. Appl. No. 14/169,325.
U.S. Office Action, dated Sep. 17, 2010, issued in U.S. Appl. No. 11/974,945.
U.S. Final Office Action, dated Mar. 21, 2011, issued in U.S. Appl. No. 11/974,945.
U.S. Office Action, dated Aug. 17, 2011, issued in U.S. Appl. No. 12/148,267.
U.S. Final Office Action, dated Jan. 30, 2012, issued in U.S. Appl. No. 12/148,267.
U.S. Office Action, dated Nov. 8, 2012, issued in U.S. Appl. No. 12/642,497.
U.S. Final Office Action, dated Apr. 8, 2013, issued in U.S. Appl. No. 12/642,497.
U.S. Office Action, dated Jul. 12, 2013, issued in U.S. Appl. No. 12/642,497.
U.S. Final Office Action, dated Nov. 6, 2013, issued in U.S. Appl. No. 12/642,497.
U.S. Office Action, dated Sep. 24, 2014, issued in U.S. Appl. No. 12/642,497.
U.S. Notice of Allowance, dated Jan. 15, 2015, issued in U.S. Appl. No. 12/642,497.
U.S. Office Action, dated May 3, 2017, issued in U.S. Appl. No. 14/687,134.
U.S. Final Office Action, dated Jul. 20, 2017, issued in U.S. Appl. No. 14/687,134.
Chinese First Office Action, dated Apr. 19, 2017, issued in Application No. CN 201510221479.6.
Chinese Second Office Action, dated Nov. 16, 2017, issued in Application No. CN 201510221479.6.
Chinese Office Action, dated May 12, 2009, issued in Application No. CN 200820135478.5.
Korean Office Action, dated Dec. 31, 2010, issued in Application No. KR 20080013796.
Chinese First Office Action, dated Feb. 8, 2014, issued in Application No. CN 201010602102.2.
Chinese Second Office Action, dated Aug. 29, 2014, issued in Application No. CN 201010602102.2.
Singapore Search and Examination Report, dated Mar. 5, 2012, issued in Application No. SG 201009408-4.
Korean First Office Action, dated Dec. 12, 2016, issued in Application No. KR 2010-0129965.
Taiwan Office Action, dated Mar. 26, 2015, issued in Application No. TW 099144608.
Taiwan Office Action, dated May 17, 2016, issued in Application No. TW104138639.
PCT International Search Report and Written Opinion dated Sep. 27, 2012 issued in PCT/US2012/027596.
PCT International Report on Patentability dated Sep. 19, 2013 issued in PCT/US2012/027596.
Novellus, XL*, High Vacuum Angle Valve, Air Operated, Lam Research, DOC-3076a, Document Control Released Oct. 25, 2012, 5 pages.
U.S. Appl. No. 10/890,376, filed Jul. 12, 2004, entitled "Method and Apparatus to Reduce the Frequency of Chamber Cleans in Rapid Vapor Deposition (RVD) of Silicon Oxide."
U.S. Notice of Allowance, dated Nov. 29, 2004, issued in U.S. Appl. No. 10/672,309.
U.S. Office Action, dated Jan. 30, 2007, issued in U.S. Appl. No. 10/890,376.
U.S. Office Action dated Sep. 22, 2005, issued in U.S. Appl. No. 10/874,814.
U.S. Notice of Allowance, dated Jun. 6, 2006, issued in U.S. Appl. No. 10/874,814.
U.S. Office Action dated Jun. 23, 2005, issued in U.S. Appl. No. 10/874,808.
U.S. Office Action, dated Dec. 7, 2005, issued in U.S. Appl. No. 10/874,808.
U.S. Notice of Allowance, dated May 18, 2006, issued in U.S. Appl. No. 10/874,808.
U.S. Office Action, dated May 23, 2006, issued in U.S. Appl. No. 11/077,198.
U.S. Notice of Allowance, dated Sep. 8, 2006, issued in U.S. Appl. No. 11/077,198.
U.S. Office Action, dated Feb. 24, 2006, issued in U.S. Appl. No. 11/077,108.
U.S. Notice of Allowance, dated Jun. 14, 2006, issued in U.S. Appl. No. 11/077,108.
U.S. Office Action, dated Apr. 21, 2010, issued in U.S. Appl. No. 11/542,959.
U.S. Final Office Action, dated Oct. 28, 2010, issued in U.S. Appl. No. 11/542,959.
U.S. Office Action, dated Feb. 16, 2011, issued in U.S. Appl. No. 11/542,959.

(56) References Cited

OTHER PUBLICATIONS

U.S. Final Office Action, dated Jul. 21, 2011, issued in U.S. Appl. No. 11/542,959.
U.S. Office Action, dated Sep. 18, 2009, issued in U.S. Appl. No. 11/542,723.
U.S. Notice of Allowance, dated Feb. 9, 2010, issued in U.S. Appl. No. 11/542,723.
U.S. Notice of Allowance, dated Apr. 8, 2010, issued in U.S. Appl. No. 11/542,723.
U.S. Office Action, dated May 19, 2010, issued in U.S. Appl. No. 11/626,328.
U.S. Final Office Action, dated Jan. 5, 2011, issued in U.S. Appl. No. 11/626,328.
U.S. Notice of Allowance, dated Apr. 4, 2011, issued in U.S. Appl. No. 11/626,328.
U.S. Office Action, dated Jul. 25, 2011, issued in U.S. Appl. No. 12/702,747.
U.S. Office Action, dated Mar. 5, 2012, issued in U.S. Appl. No. 12/702,747.
U.S. Final Office Action, dated Sep. 6, 2012, issued in U.S. Appl. No. 12/702,747.
U.S. Office Action, dated Jun. 11, 2013, issued in U.S. Appl. No. 12/702,747.
U.S. Final Office Action, dated Dec. 27, 2013, issued in U.S. Appl. No. 12/702,747.
U.S. Office Action, dated Dec. 19, 2014, issued in U.S. Appl. No. 12/702,747.
U.S. Final Office Action, dated May 18, 2015, issued in U.S. Appl. No. 12/702,747.
U.S. Office Action, dated Jan. 16, 2015, issued in U.S. Appl. No. 13/857,799.
U.S. Final Office Action, dated Nov. 6, 2015, issued in U.S. Appl. No. 13/857,799.
U.S. Notice of Allowance, dated Feb. 1, 2016, issued in U.S. Appl. No. 13/857,799.
PCT International Search Report and Written Opinion dated Jan. 10, 2008, issued in PCT/US2007/015979.
PCT International Preliminary Report on Patentability and Written Opinion dated Apr. 7, 2009, issued in PCT/US2007/015979.
US Notice of Allowance dated May 30, 2018, issued in U.S. Appl. No. 13/842,054.
U.S. Final Office Action, dated May 18, 2018, issued in U.S. Appl. No. 14/716,823.
U.S. Office Action, dated Apr. 4, 2018, issued in U.S. Appl. No. 14/850,816.
Chinese First Office Action dated Apr. 10, 2018, issued in Application No. CN 201610361563.2.

\* cited by examiner

ANTI-TRANSIENT SHOWERHEAD

CROSS REFERENCE TO RELATED APPLICATIONS

This application claims benefit of priority under 35 U.S.C. § 119(e) to U.S. Provisional Application No. 62/166,612, filed on May 26, 2015, and titled "ANTI-TRANSIENT SHOWERHEAD," which is hereby incorporated by reference herein in its entirety.

BACKGROUND

Semiconductor processing tools often include components designed to distribute process gases in a relatively even manner across a semiconductor substrate or wafer. Such components are commonly referred to in the industry as "showerheads." Showerheads typically include a faceplate that fronts a semiconductor processing volume in which semiconductor substrates or wafers may be processed. The faceplate may include a plurality of gas distribution ports that allow gas in the plenum volume to flow through the faceplate and into a reaction space between the substrate and the faceplate (or between a wafer support supporting the wafer and the faceplate). In some instances, a showerhead may be configured to distribute two different gases across a semiconductor substrate or wafer in a simultaneous fashion while isolating the gases from each other within the showerhead. The gas distribution ports are typically arranged such that the gas distribution across the wafer results in substantially uniform substrate processing.

SUMMARY

One aspect of the disclosure pertains to an apparatus having: a first gas inlet, a first surface, a plurality of first gas distribution ports, a second surface, a third surface interposed between the first surface and the second surface, a fourth surface interposed between the third surface and the second surface, and a plurality of first gas flow passages interposed between the first surface and the third surface. In such an apparatus, the first gas inlet may be configured to deliver a first process gas through the first surface and the first gas distribution ports may be configured to deliver the first process gas through the second surface.

The apparatus may have a first inlet plenum volume that is fluidically connected with the first gas inlet, the first inlet plenum volume being at least partially defined by the first surface and the third surface. The apparatus may further have a first gas distribution plenum volume that is fluidically connected with the first gas distribution ports, the first gas distribution plenum volume being at least partially defined by the second surface and the fourth surface.

The first gas flow passages may each have a first end that fluidically connects that first gas flow passage with the first inlet plenum volume and a second end that fluidically connects that first gas flow passage with the first gas distribution plenum volume. Each first gas flow passage may be substantially the same overall length, extend away from the first inlet plenum volume at the first end, and include between 140° and 200° of bends between the first end and the second end such that the second end of that first gas flow passage is oriented towards the first inlet plenum volume.

In some embodiments, the second end of each first gas flow passage may be fluidically connected with the first gas distribution plenum volume by a corresponding first hole passing through the fourth surface; each first hole may have a nominal hole diameter. In some embodiments, a plurality of first raised bosses may extend up from the second surface towards the fourth surface, each first raised boss centered on one of the first holes and having a nominal boss diameter. In some such embodiments, each first raised boss may be offset from the fourth surface by a distance of between 0.025 mm and 1.2 mm. In other or additional such embodiments, each first raised boss may be offset from the fourth surface by a distance of between $1/11$th and $1/13$th of the nominal diameter. In yet other additional or alternative such embodiments, each first raised boss may be offset from the fourth surface by a distance that is less than twice the difference between the nominal boss diameter and the nominal hole diameter and is greater than 0.2 times the difference between the nominal boss diameter and the nominal hole diameter.

In some embodiments, a different subset of first gas distribution ports may be adjacent to each of the first raised bosses and each first raised boss may be centered between the first gas distribution ports in the plurality of first gas distribution ports adjacent to that first raised boss.

In some embodiments, a plurality of first support columns may span between the second surface and the fourth surface.

In certain embodiments, the first holes may have diameters between 1.5 mm and 3 mm, and in certain alternative or additional embodiments, the first bosses may have diameters that are between 5 mm and 8 mm.

In some embodiments, the apparatus may also include a plurality of first peninsulas. Each first peninsula may protrude into the first inlet plenum volume, and the second end of one or more of the first gas flow passages may extend into each of the first peninsulas. In such an embodiment, the second end of the first gas flow passages in the first peninsulas may be closer to the first center point of the first inlet plenum volume than the first ends of such first gas flow passages.

In some embodiments, the first gas flow passages may include between 150° and 190° of bends between the first end and the second end. In some embodiments, each of the first gas flow passages may have a length within ±30%, ±20, ±10%, or ±5% of the other first gas flow passages.

In some embodiments, each of the first gas flow passages may have a constant cross-sectional area along its length. In some embodiments, the first end of each of the first gas flow passages may be equidistant from a first axis of the apparatus. In some embodiments, the apparatus may include between 20 and 100 first gas flow passages.

In some embodiments, the apparatus may also include: a second gas inlet, a fifth surface, a plurality of second gas distribution ports, a sixth surface, a seventh surface interposed between the fifth surface and the sixth surface, an eighth surface interposed between the sixth surface and the seventh surface, and a plurality of second gas flow passages interposed between the fifth surface and the seventh surface. In such embodiments, the second gas inlet may be configured to deliver a second process gas through the fifth surface and the second gas distribution ports may be configured to deliver the second process gas through the sixth surface.

In some embodiments, the apparatus may have a second inlet plenum volume that is fluidically connected with the second gas inlet. The second inlet plum volume may be at least partially defined by the fifth surface and the seventh surface. The apparatus may further have a second gas distribution plenum volume that is fluidically connected with the second gas distribution ports and the second gas distribution plenum volume may be at least partially defined by the sixth surface and the eighth surface.

In some embodiments, the second gas flow passages may each have a first end that fluidically connects that second gas flow passage with the second inlet plenum volume and a second end that fluidically connects that second gas flow passage with the second gas distribution plenum volume. Each second gas flow passage may be substantially the same overall length, extend away from the second inlet plenum volume at the first end, and include between 140° and 200° of bends between the first end and the second end such that the second end of that second gas flow passage is oriented towards the first inlet plenum volume.

In some embodiments, the second end of each first gas flow passage of such an apparatus may be fluidically connected with the first gas distribution plenum volume by a corresponding first hole passing through the fourth surface; each first hole may have a nominal hole diameter. In some cases, a plurality of first raised bosses may extend up from the second surface towards the fourth surface, and each first raised boss may be centered on one of the first holes and may have a nominal boss diameter. In such an embodiment, the second end of each second gas flow passage may also be fluidically connected with the second gas distribution plenum volume by a corresponding second hole passing through the eighth surface; each second hole may have a nominal hole diameter. In some cases, a plurality of second raised bosses extend up from the sixth surface towards the eighth surface, where each second raised boss is centered on one of the second holes and may have a nominal boss diameter.

In some cases, each first raised boss may be offset from the fourth surface and/or each second raised boss may be offset from the eighth surface by a distance of between 0.025 mm and 1.2 mm. In other or additional cases, each first raised boss may be offset from the fourth surface and/or each second raised boss may be offset from the eighth surface by a distance of between 1/11th and 1/13th of the respective nominal diameter of each raised boss. In yet other cases, each first raised boss may be offset from the fourth surface and/or each second raised boss may be offset from the eighth surface by a distance that is less than twice the difference between the nominal boss diameter and the respective nominal hole diameter and is greater than 0.2 times the difference between the nominal boss diameter and the respective nominal hole diameter.

In certain embodiments, the apparatus may have one or more additional first gas inlets, and the first inlet plenum volume may be partitioned into multiple first inlet plenum sub-volumes which are each fed by a different one of the first gas inlets.

In certain embodiments, the first inlet plenum volume and the first gas distribution plenum volume may be interposed between the second inlet plenum volume and the second gas distribution plenum volume. In other embodiments, the first inlet plenum volume and the second gas distribution plenum volume may be interposed between the second inlet plenum volume and the first gas distribution plenum volume.

In some embodiments, a different subset of first gas distribution ports in the apparatus are adjacent to each of the first raised bosses and each first raised boss is centered between the first gas distribution ports adjacent to that first raised boss.

In some embodiments, a different subset of second gas distribution ports in the modified apparatus are adjacent to each of the second raised bosses and each second raised boss is centered between the second gas distribution ports adjacent to that second raised boss.

In certain embodiments, the apparatus may also contain a plurality of first support columns that span between the second surface and the fourth surface and a plurality of second support columns that span between the sixth surface and the eighth surface.

In some embodiments, the apparatus may also include a plurality of first peninsulas, each first peninsula protruding into the first inlet plenum volume and the second end of one or more of the first gas flow passages extending into each of the first peninsulas. In such an embodiment, the second end of the first gas flow passages in the first peninsulas may be closer to the first center point of the first inlet plenum volume than the first ends of those first gas flow passages.

In some embodiments, the apparatus may also have a plurality of second peninsulas, each second peninsula protruding into the second inlet plenum volume and the second end of one or more of the second gas flow passages extending into each of the second peninsulas. In such an embodiment, the second end of the second gas flow passages in the second peninsulas may be closer to the second center point of the second inlet plenum volume than the first ends of those second gas flow passages.

BRIEF DESCRIPTION OF THE DRAWINGS

FIGS. 1 through 12 are drawn to scale within each Figure, although the scale from Figure to Figure may vary.

DETAILED DESCRIPTION

Figure 1:
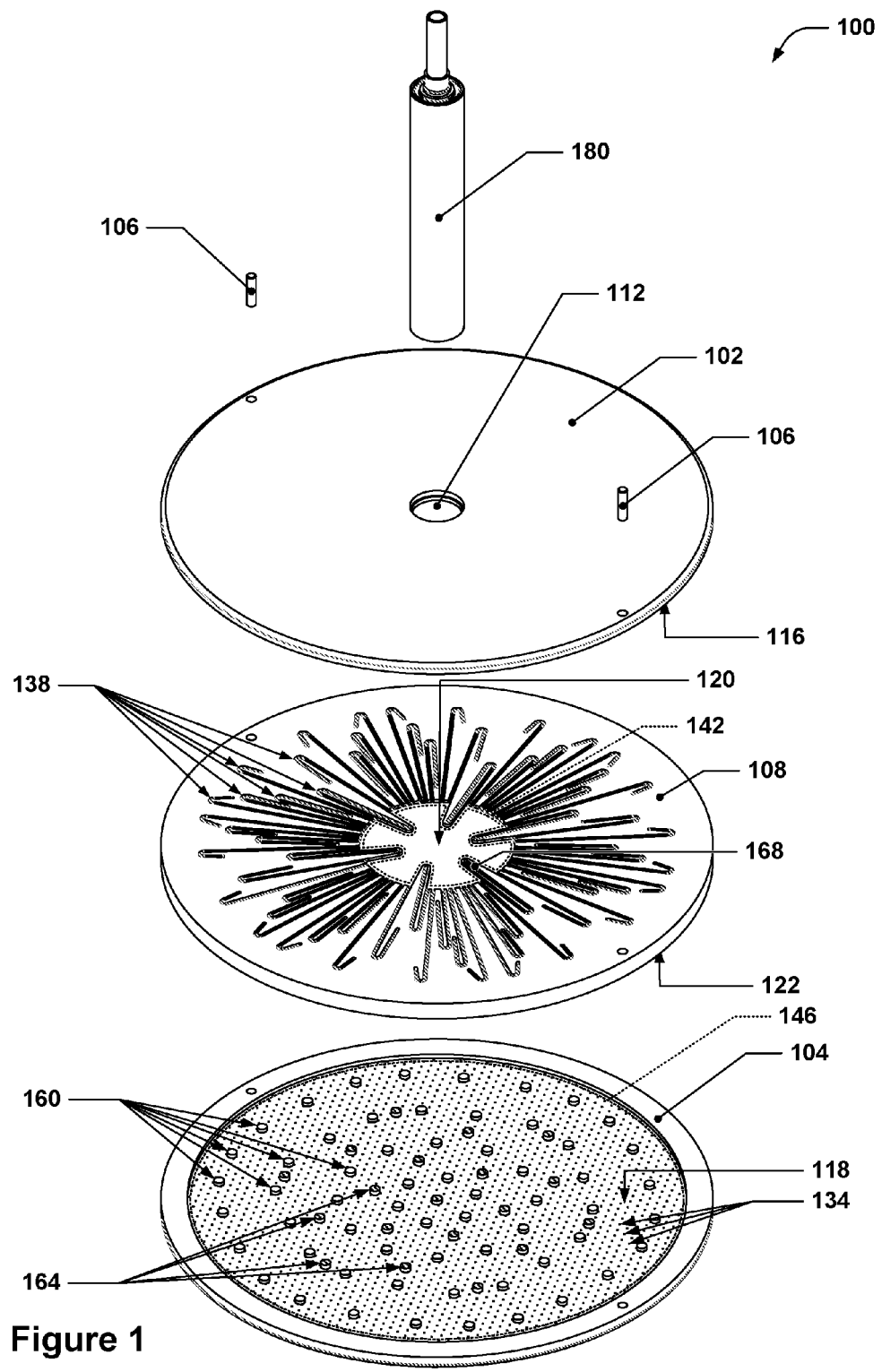
FIG. 1 depicts an isometric exploded view of an example anti-transient showerhead.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this application, the terms "semiconductor wafer," "wafer," "substrate," "wafer substrate," and the like are used interchangeably. A wafer or substrate used in the semiconductor device industry typically has a diameter of 200 mm, 300 mm, or 450 mm, but may also be non-circular and of other dimensions. In addition to semiconductor wafers, other work pieces that may take advantage of this invention include various articles such as printed circuit boards, magnetic recording media, magnetic recording sensors, mirrors, optical elements, micro-mechanical devices and the like.

Several conventions may have been adopted in some of the drawings and discussions in this disclosure. For example, reference is made at various points to "volumes," e.g., "plenum volumes." These volumes may be generally indicated in various Figures, but it is understood that the Figures and the accompanying numerical identifiers represent an approximation of such volumes, and that the actual volumes may extend, for example, to various solid surfaces that bound the volumes. Various smaller volumes, e.g., gas inlets or other holes leading up to a boundary surface of a plenum volume, may be fluidly connected to those plenum volumes.

It is to be understood that the use of relative terms such as "above," "on top," "below," "underneath," etc. are to be understood to refer to spatial relationships of components with respect to the orientations of those components during normal use of a showerhead or with respect to the orientation of the drawings on the page. In normal use, showerheads are typically oriented so as to distribute gases downwards towards a substrate during substrate processing operations.

Semiconductor fabrication often requires that process gases, such as deposition and etch gases, be flowed in a uniform or controlled manner over a semiconductor wafer or substrate undergoing processing. To that end, a "showerhead," also referred to herein as a gas distribution manifold and sometimes also referred to as a gas distributor, may be used to distribute gases across the surface of a wafer. When gas is initially flowed into a showerhead, it may take varying amounts of time for the initial gas flow to reach each of the gas distribution ports arranged across the faceplate of the showerhead, which may result in a non-uniform gas distribution across the face of the showerhead. After the gas flow through the showerhead has stabilized, e.g., after the pressure environment within the plenum volume(s) of the showerhead has stabilized, the gas flow may be much more uniform. During the initial transient period, however, the pressure within the plenum volumes may fluctuate, and this may result in unbalanced flow characteristics across the faceplate. Due to the unpredictability of such transient flow, the transient flow period is typically "lost" time during a semiconductor process.

During long-duration semiconductor processes, e.g., processes having cycle times of hundreds of seconds or longer, the transient period, which may be a few seconds, may constitute a relatively small portion of the overall cycle duration, and thus the "lost" time may constitute a relatively small fraction of the overall cycle time. In short duration semiconductor processes, however, such as atomic layer deposition (ALD), the transient period may have a much more pronounced effect. For example, in ALD, gas delivery times on the order of seconds or tenths of a second are common—if each cycle must also accommodate the time lost due to transients, then it is easy to see how transient loss may dramatically lengthen the overall process time.

The anti-transient showerheads discussed herein provide a new mechanism for minimizing or reducing transient gas flow response, or even eliminating it entirely for the relevant cycle time, from semiconductor processing systems.

Anti-transient showerheads, generally speaking, may be configured with at least two plenums—a gas inlet plenum and a gas distribution plenum. Each of these plenums may define a separate plenum volume. Such showerheads may also include a multitude of gas flow passages that are fluidically connected with the gas inlet plenum volume at a first end and with the gas distribution plenum volume at the second end. In many cases, a partition plate may separate the gas inlet plenum from the gas distribution plenum, and the gas flow passages may be machined into one face of the partition plate; holes located at the second end of the gas flow passages may allow gas that flows from the inlet plenum volume and into the gas flow passages to then pass through the partition plate and into the gas distribution plenum volume. The purpose of the gas flow passages is to deliver substantially equal proportions of gas from the inlet plenum volume to distributed locations with the gas distribution plenum volume. For example, the second ends of the gas flow passages may be arranged in a plurality of concentric or near-concentric, e.g., having center points within a few millimeters of each other, circular patterns so as to deliver gas into the gas distribution plenum volume at various distributed locations. Thus, some second ends may be located near the periphery of the gas distribution plenum volume, some towards the center of the gas distribution plenum volume, and some in between those two locations.

Each gas flow passage may have substantially the same length, e.g., having ±5% variation in length, and may maintain a similar cross-sectional profile or area along its length, e.g., each gas flow passage may have a constant cross-sectional area along its length. Each gas flow passage may also include one or more bends that cause the gas flow passage to ultimately change direction by ±X degrees from some common angle, e.g., 170°±15° or ±20° between the first end and the second end. These bends may include, by way of example, a single bend of 170°, two bends of 100° and 70°, three bends of 50°, 40°, and 80°, etc. The number of bends in each gas flow passage may be the same, or may vary from passage to passage—regardless of how many bends are in each passage, however, the total bend angle for each passage may be within the limits stated above. It is to be understood that the "total bend angle" is the total of the absolute values of the bend angles for a given gas flow passage. Thus, if a gas flow passage undergoes a bend of 90° to the left and then 90° to the right, the total bend angle would be 180°, not 0°. By including the same nominal total bend angle, cross-sectional area profile, and passage length in each gas flow passage, the gas flow passages may be caused to exhibit substantially similar flow resistance, which may cause gas that is flowed through the gas flow passages to flow at the same rates through all of the passages, even during transient flow. In some implementations, the total bend angle may be between, but not limited to, 140° to 200° degrees, i.e., more relaxed or more bent than the 170°±15° discussed above.

Further performance increases may be obtained by including a plurality of raised bosses that protrude up from the faceplate towards the holes that deliver the gas from the gas flow passages to the gas distribution plenum volume. Each of these raised bosses may be centered underneath a corresponding one of the holes such that gas that exits the hole impinges on the center of the raised boss, causing the gas to undergo a change of flow direction of approximately 90°, e.g., the gas flow changes from flowing along the hole axis to flowing in a direction generally parallel to the faceplate. The raised boss thus acts as a "mini-baffle" that serves to further distribute the gas in a more even manner throughout the gas distribution plenum volume.

FIG. 1 depicts an isometric exploded view of an example anti-transient showerhead. As can be seen, an anti-transient showerhead 100 is shown. The showerhead 100 includes a stem 180 that may be used to deliver a first process gas to the showerhead 100; the stem may provide gas to a first gas inlet 112 (alternatively, the stem 180 also may be thought of as the first gas inlet 112). The stem 180 may connect with a backplate 102, e.g., through a brazed, diffusion bonded, welded, or bolted connection. The backplate 102 may, in turn, be mated with a first partition plate 108. The first partition plate 108 may include various features that are machined or otherwise formed into it that define a first inlet plenum volume 142 and a plurality of first gas flow passages 138. The first gas flow passages 138 may have first ends that are fluidically connected with the first inlet plenum volume 142 and that are arranged along an outer perimeter of the first inlet plenum volume 142; the first gas flow passages 138 may generally radiate outwards from this outer perimeter of the first inlet plenum volume 142 before substantially reversing their direction by virtue of the above-mentioned bends in each first gas flow passage 138.

The showerhead 100 may also include a faceplate 104 that includes a plurality of first gas distribution ports 134 arranged in a pattern across the faceplate 104. The faceplate 104 may be mated to the first partition plate 108 such that a first gas distribution plenum volume 146 is formed. The first gas distribution plenum volume 146 may be fluidically connected with the first inlet plenum volume 142 by the plurality of first gas flow passages 138.

Generally speaking, the first inlet plenum volume 142 and the first gas distribution plenum volume 146 may be bounded, at least in part, various major surfaces. For example, the backplate 102 may provide a first surface 116 through which process gas may be introduced from the first gas inlet 112 and into the first inlet plenum volume 142; the first surface 116 may thus act as one boundary for the first inlet plenum volume 142. Similarly, the faceplate 104 may provide a second surface 118 through which the process gas may be flowed from the first gas distribution plenum volume 146 by way of the first gas distribution ports 134; the second surface 118 may thus act as one boundary for the first gas distribution plenum volume 146. Similarly, the first partition plate 108 may have a third surface 120 and a fourth surface 122, which may serve as further boundaries for the first inlet plenum volume 142 and the first gas distribution plenum volume 146, respectively.

It is to be understood that these surfaces need not necessarily be provided by the exact components depicted. In fact, in some implementations, there may not even be discrete faceplates, backplates, or partition plates. For example, the showerhead 100 may be manufactured as a monolithic structure, e.g., by using additive manufacturing techniques such as direct laser metal sintering or, if a ceramic showerhead is desired, a ceramic sintering process. In implementations where multiple plate structures are used, such as in the depicted example, it may be desirable to include an indexing pin 106 or other similar feature to ensure that the various plates are lined up correctly. It is to be understood that if a multiple-plate structure is used, the various plates that form the overall showerhead structure may be brazed or diffusion bonded together along their mating surfaces to prevent gas flow between the contacting surfaces of the plates.

Also visible in FIG. 1 are a plurality of first raised bosses 160, each of which is positioned beneath the second end of the one of the first gas flow passages 138. In addition to the first raised bosses, a number of first support columns 164 may be optionally included. Unlike the first raised bosses 160, which do not contact the fourth surface 122, the first support columns 164 may provide structural support and a thermally conductive path to the faceplate 104, and thus may extend to and contact the fourth surface 122 (and may be brazed or diffusion bonded to it for structural support).

From a practical perspective, it may be desirable to include a large number of gas flow passages in an anti-transient showerhead. However, as the number of gas flow passages included in an anti-transient showerhead increases, the size of the corresponding inlet plenum volume must also increase to accommodate the increased number of junctions between each gas flow passage and the inlet plenum volume along the perimeter of the inlet plenum volume. At some point, as the number of gas flow passages is increased, the size of the inlet plenum volume may expand to a large enough extent that it may be desirable to place some of the holes that feed gas from the gas flow passages to the gas distribution plenum volume within the perimeter of the gas inlet plenum volume. In order to do so while maintaining fluidic isolation between each gas flow passage, a number of peninsulas may be included. Each peninsula may protrude into the inlet plenum volume from the nominal outermost perimeter of the inlet plenum volume. Each peninsula may include one or more gas flow passages that may be used to deliver gas to such locations.

Figure 2:
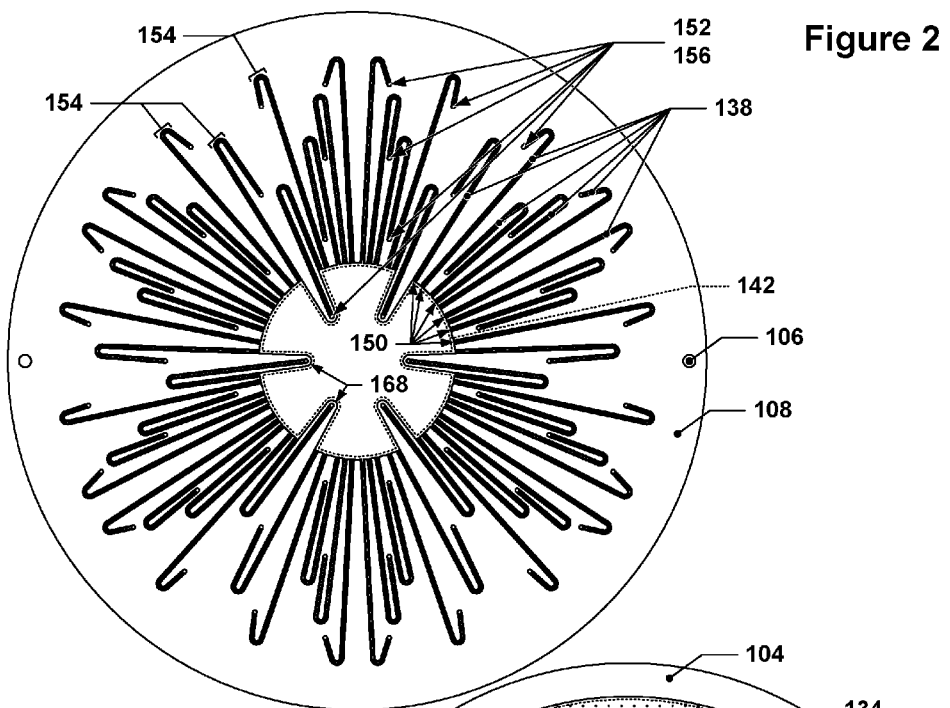
FIG. 2 depicts a plan view of a first partition plate of the example anti-transient showerhead of FIG. 1.

FIG. 2 depicts a plan view of the first partition plate 108 of the example anti-transient showerhead of FIG. 1. As can be seen in more detail in this Figure, each first gas flow passage 138 has a bend 154 that occurs at some point along the passage's length. Moreover, each first gas flow passage 138 has substantially the same length as the other first gas flow passages 138, in this case, ~170 mm±5%. For purposes of illustration, the first gas flow passages 138 in this example are approximately 2 mm wide. Each first gas flow passage 138 is fluidically connected with the first inlet plenum volume 142 at a first end 150 and is fluidically connected to the first gas distribution plenum volume 146 at a second end 152 by way of a first hole 156. As can be seen, six of the first holes 156 are located within the outermost circumference of the first inlet plenum volume 142; the first gas flow passages 138 that provide gas to these first holes 156 are partitioned off from the first inlet plenum volume 142 by peninsulas 168, which extend into the first inlet plenum volume 142. As can be seen in the showerhead 100, there are sixty first gas flow passages 138 radiating out from the first inlet plenum volume 142. Such a high number of first gas flow passages 138 would not be able to fit (at the indicated passage width) along the outer perimeter of the first inlet plenum volume 142 if the first inlet plenum volume was sized so as to be within the innermost pattern of first holes 156 (the first holes 156 that are located within the peninsulas 168).

Figure 3:
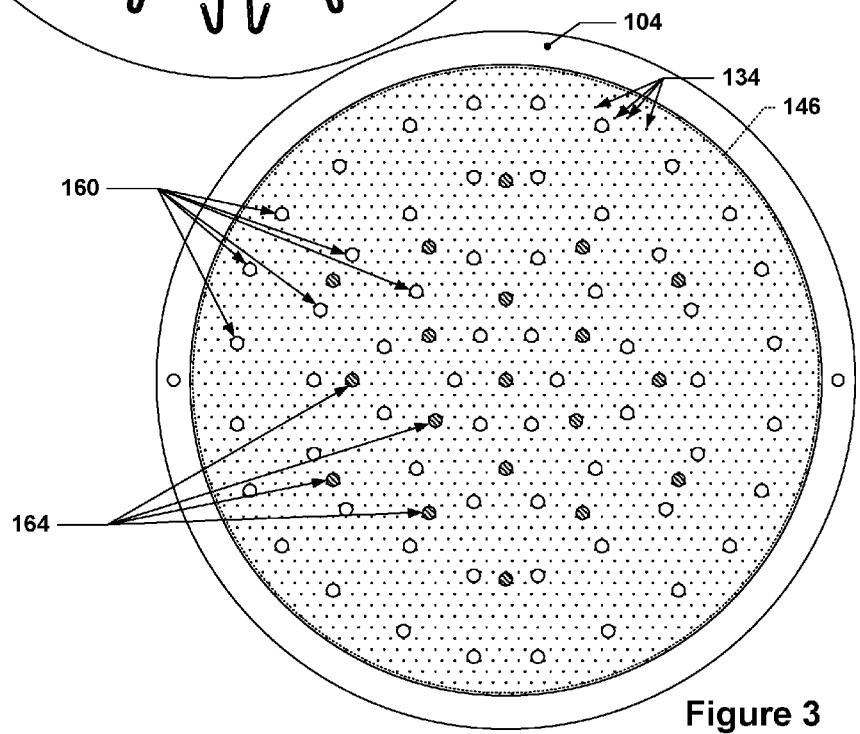
FIG. 3 depicts a plan view of a faceplate of the example anti-transient showerhead of FIG. 1.

FIG. 3 depicts a plan view of the faceplate 104 of the example anti-transient showerhead of FIG. 1. As can be seen, the first raised bosses 160 are arranged in a relatively distributed manner throughout the first gas distribution plenum volume 146

Figure 4:
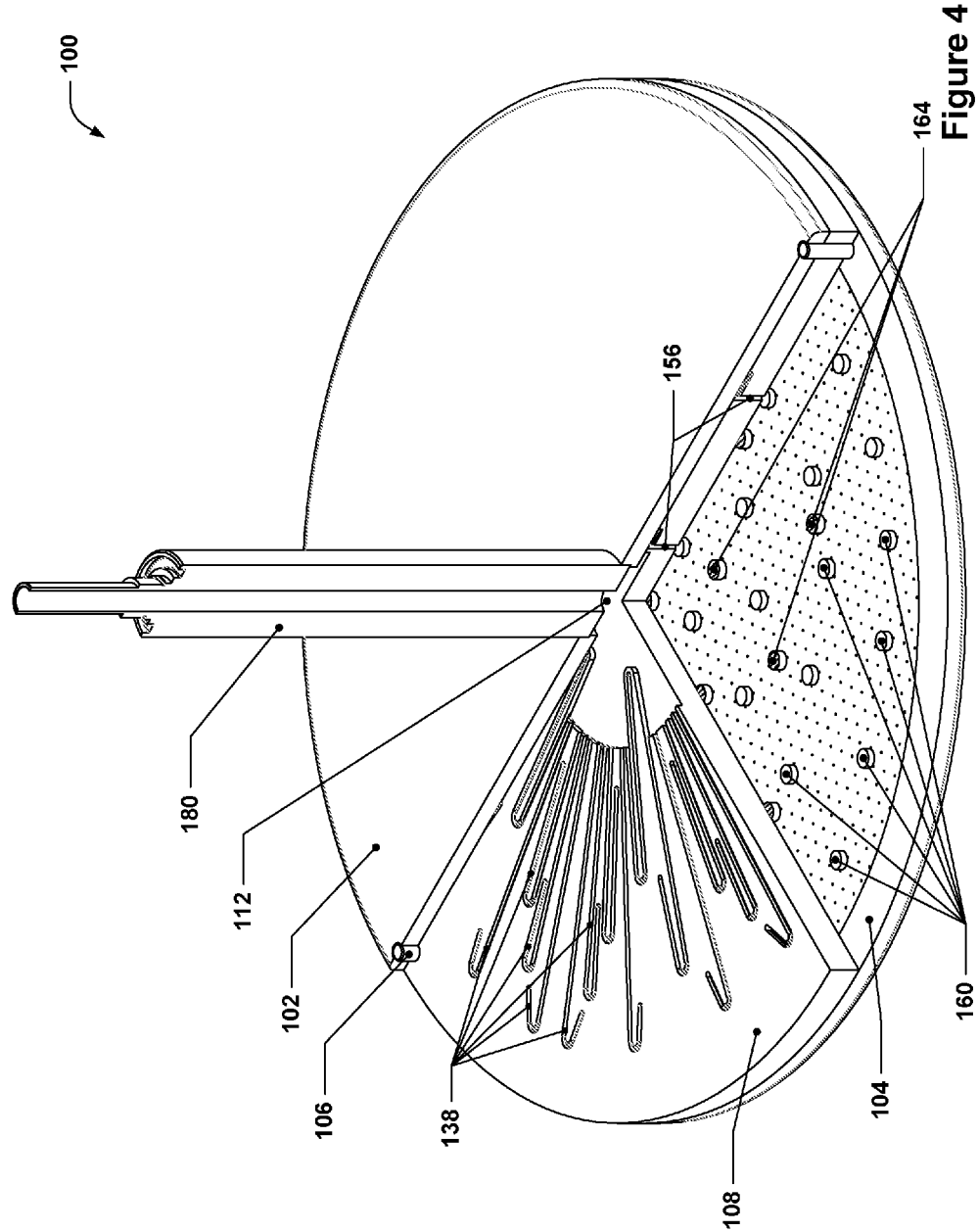
FIG. 4 depicts an isometric cutaway view of the example anti-transient showerhead of FIG. 1.

FIG. 4 depicts an isometric cutaway view of the example anti-transient showerhead of FIG. 1. As can be seen, each first hole 156 is positioned directly above a corresponding first raised boss 160. Gas that flows into the first inlet plenum volume 142 through the first gas inlet 112 may generally reach the first ends 150 of all of the first gas flow passages 138 at the same time and may, by virtue of the first gas flow passages 138 being nominally the same length and having nominally the same total bend angle and cross-sections along their length, reach the second ends 152 of the first gas flow passages 138 at generally the same time. This has the result of introducing the gas into the first gas distribution plenum volume at a plurality of points, e.g., each first hole 156, more or less simultaneously. The first raised bosses 160 may the act to further distribute the gas throughout the first gas distribution plenum volume 146 such that the gas flows through the first gas distribution ports 134 in a generally uniform manner, even when the gas flow within the showerhead 100 has not yet reached steady state.

Figure 5:
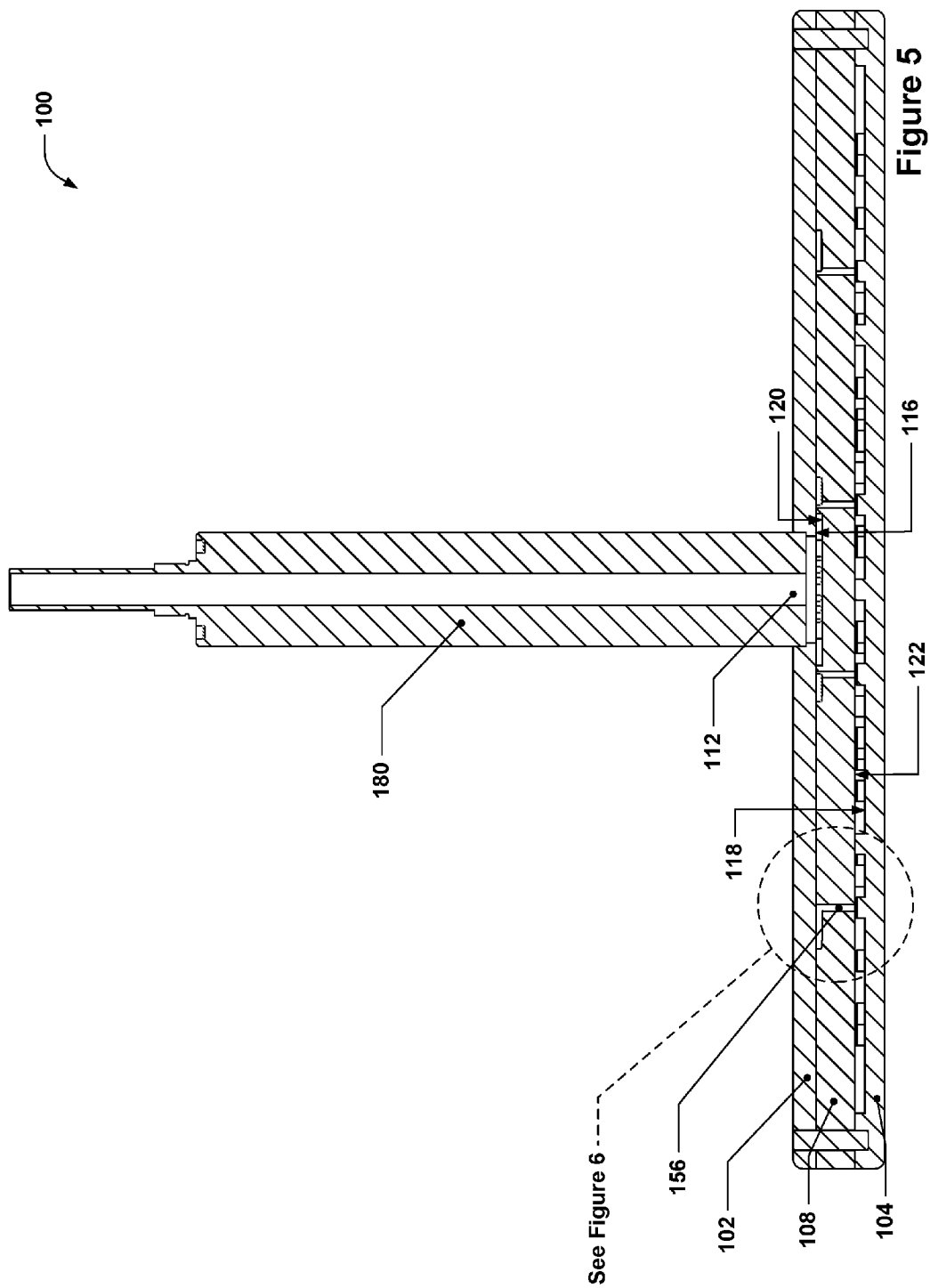
FIG. 5 depicts a section view of the example anti-transient showerhead of FIG. 1.

FIG. 5 depicts a section view of the example anti-transient showerhead of FIG. 1. The various plates, e.g., the faceplate 104, the backplate 102, and the first partition plate 108, are depicted, as well as the first surface 116, the second surface 118, the third surface 120, and the fourth surface 122. FIG. 5 also indicates a circled area that is show in more detail in FIG. 6.

Figure 6:
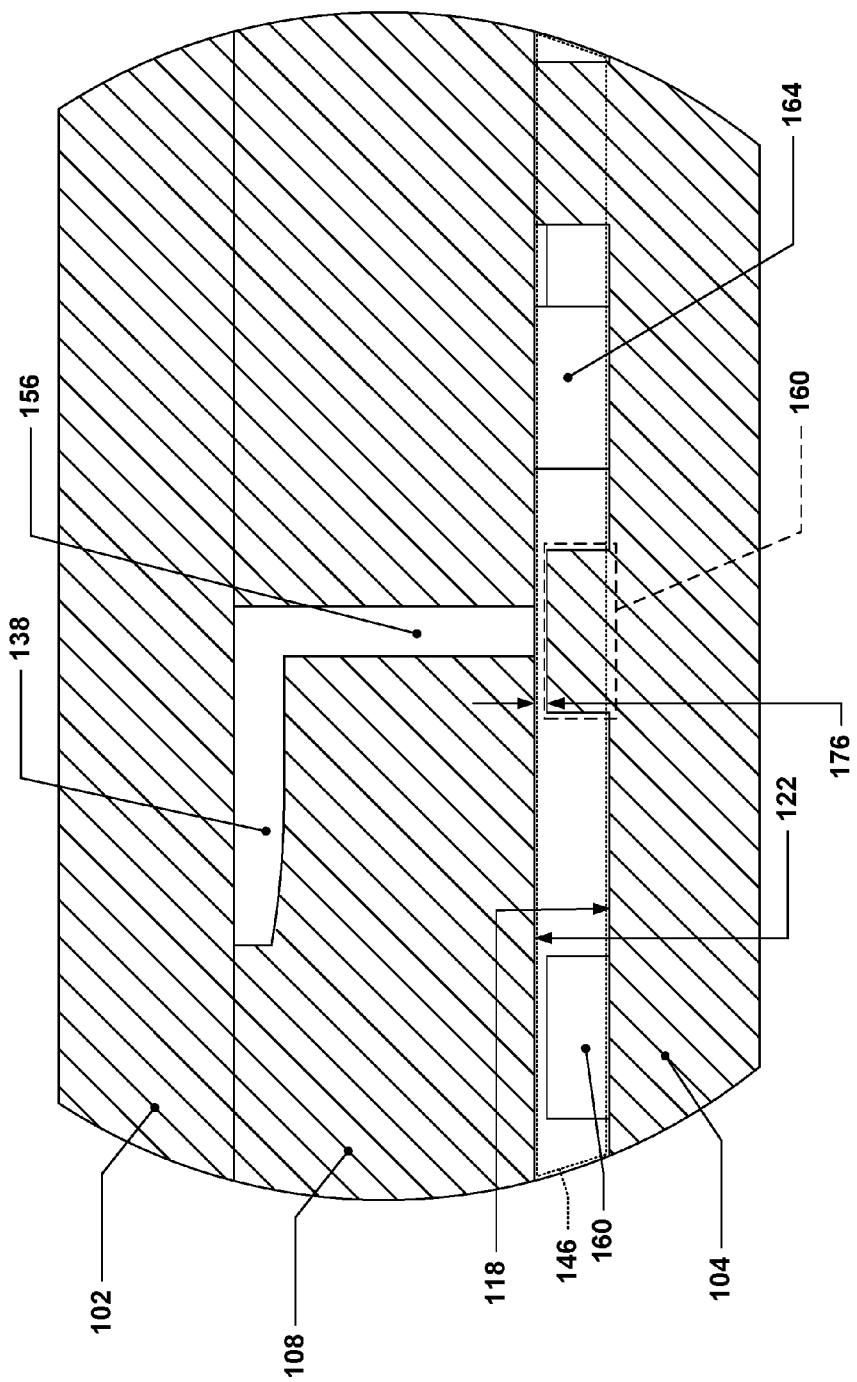
FIG. 6 depicts a detail view of a portion of FIG. 5.

FIG. 6 depicts a detail view of a portion of FIG. 5. This detail view shows the second end 152 of one of the first gas flow passages 138, as well as the first hole 156 that fluidically connects the first gas flow passage 138 to the first gas distribution plenum volume 146. Also depicted in FIG. 6 is a first support column 164, which spans between the second surface 118 and the fourth surface 122. Two first raised bosses 160 are also visible, including one that is directly beneath the first hole 156. As is evident, the first raised boss 160 below the first hole 156 is centered underneath the first hole 156. Moreover, a first gap 176 exists between the first raised boss 160 and the fourth surface 122. In the depicted example, the first hole 156 has a diameter of 2 mm, the first raised boss 160 a diameter of 6.5 mm, and the first gap 176 is 0.5 mm. In several implementations, the first gap 176 may be a function of the nominal diameter of the first raised boss 160 and may, in some such implementations, range from $\frac{1}{11}$th of the raised boss nominal diameter to $\frac{1}{13}$th of the raised boss nominal diameter, e.g., approximately $\frac{1}{12}$th of the raised boss diameter. In other implementations, the first gap 176 may be a function of the nominal diameter of the first raised boss 160 and the diameter of the first hole 156, e.g., the first gap 176 may be selected such that the first gap 176 divided by twice the difference between the first raised boss 160 diameter and the first hole 156 diameter is between 0.1 and 1.

The previous example was directed at a showerhead 100 that only supports flow of a single process gas. As discussed, the concepts discussed herein may be applied to multi-flow or multi-plenum showerheads as well. This concept is discussed in more detail below with respect to a showerhead configured to flow two process gases simultaneously. Many of the structures in this dual-flow example correspond with structures discussed previously with respect to the single-flow showerhead 100. To avoid prolixity, these components may not be described again below; in such cases, the previous discussion of similar structures in the showerhead 100 may be referred to for a description. Components that are similar between the showerhead 100 and the dual-flow showerhead discussed below may share the last two digits of their drawing reference numbers in common.

Figure 7:
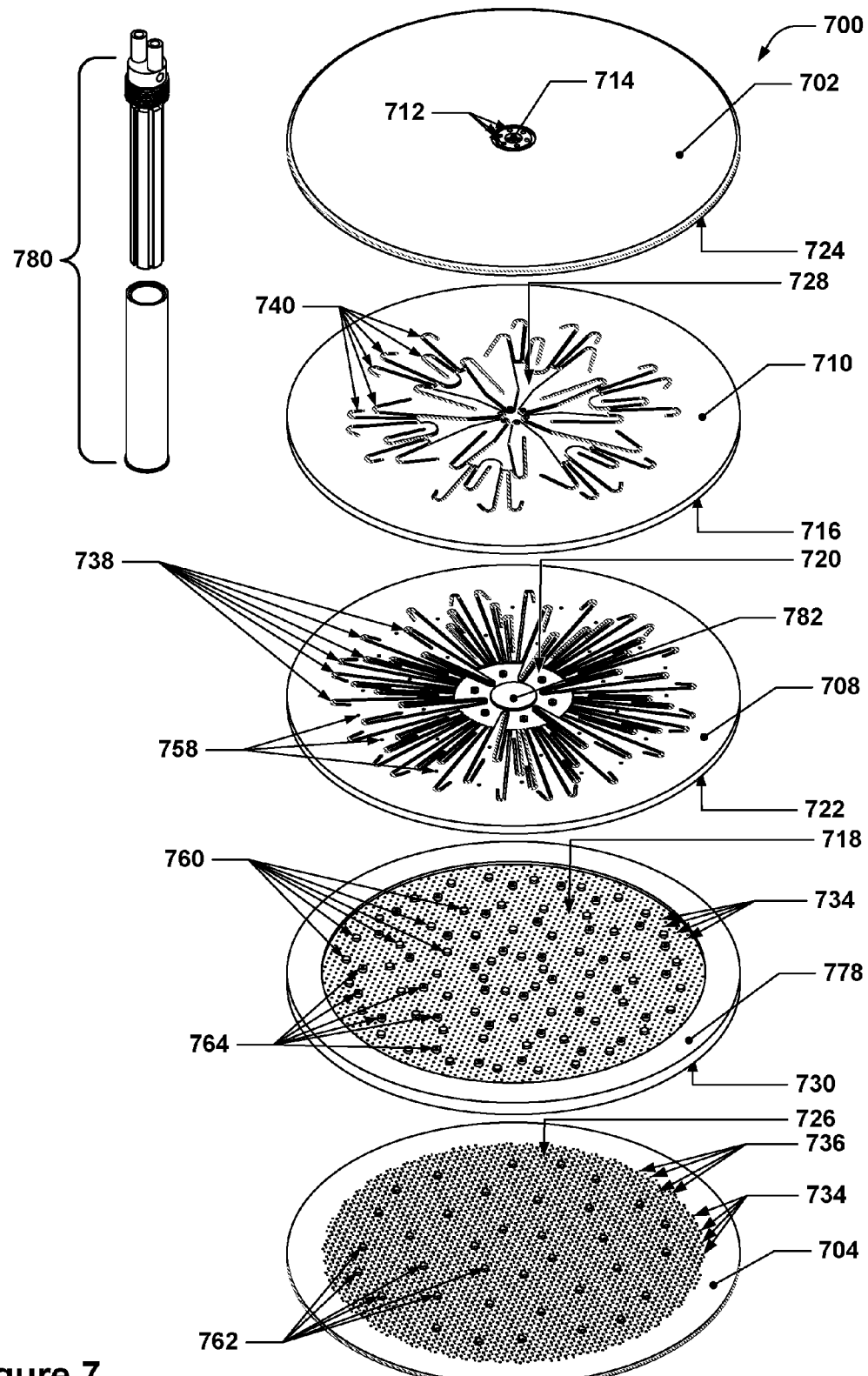
FIG. 7 depicts an isometric exploded view of an example anti-transient, dual-plenum showerhead.

FIG. 7 depicts an isometric exploded view of an example anti-transient, dual-plenum showerhead. As can be seen, a stem 780 is provided that allows for two separate gases to be supplied to a showerhead 700; the stem may be connected to a backplate 702. The stem 780 may include two sets of passages, one that includes a passage that runs along the center of the stem 780, and the other that includes a circular array of passages that is interposed between that center passage and an outer sleeve (the lower portion of the stem 780 shown). In this example, the circular array of gas flow passages in the stem provides gas for a first gas inlet 712 (six holes arrayed about the center hole of the backplate 702), and the center gas flow passage provides gas for the second gas inlet 714 (the center hole in the backplate 702). The showerhead 700 may also include a first partition plate 708, a second partition plate 710, a baffle plate 778, and a faceplate 704.

Figure 8:
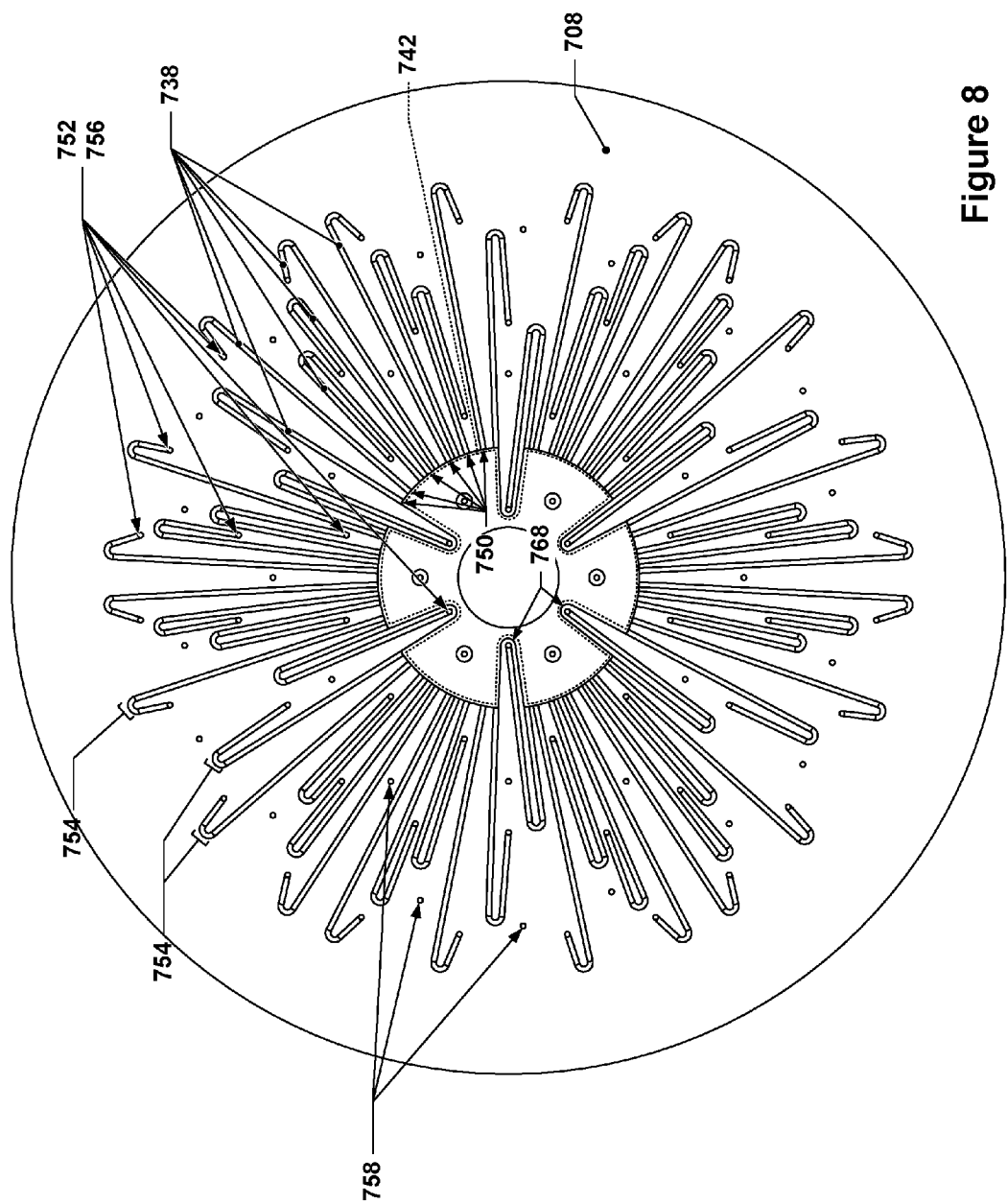
FIG. 8 depicts a plan view of a first partition plate of the example anti-transient, dual-plenum showerhead of FIG. 7.

FIG. 8 depicts a plan view of the first partition plate of the example anti-transient, dual-plenum showerhead of FIG. 7. The first partition plate 708 is very similar to the first partition plate 108, but with at least two differences. For example, there may be a raised center boss 782 that is located at the center of the first inlet plenum volume 742; this raised center boss 782 may serve to decrease the size of the first inlet plenum volume 742 to decrease the amount of time it takes to flow the first process gas through the first inlet plenum volume, and may also, in some implementations, help even out the gas flow from the six ports that serve as the first gas inlet 712. In some implementations, the first inlet plenum volume may be partitioned into multiple first inlet plenum sub-volumes, each fed by a different one of the first gas inlets. The other difference is that there are a number of second holes 758 through the first partition plate 708.

Figure 9:
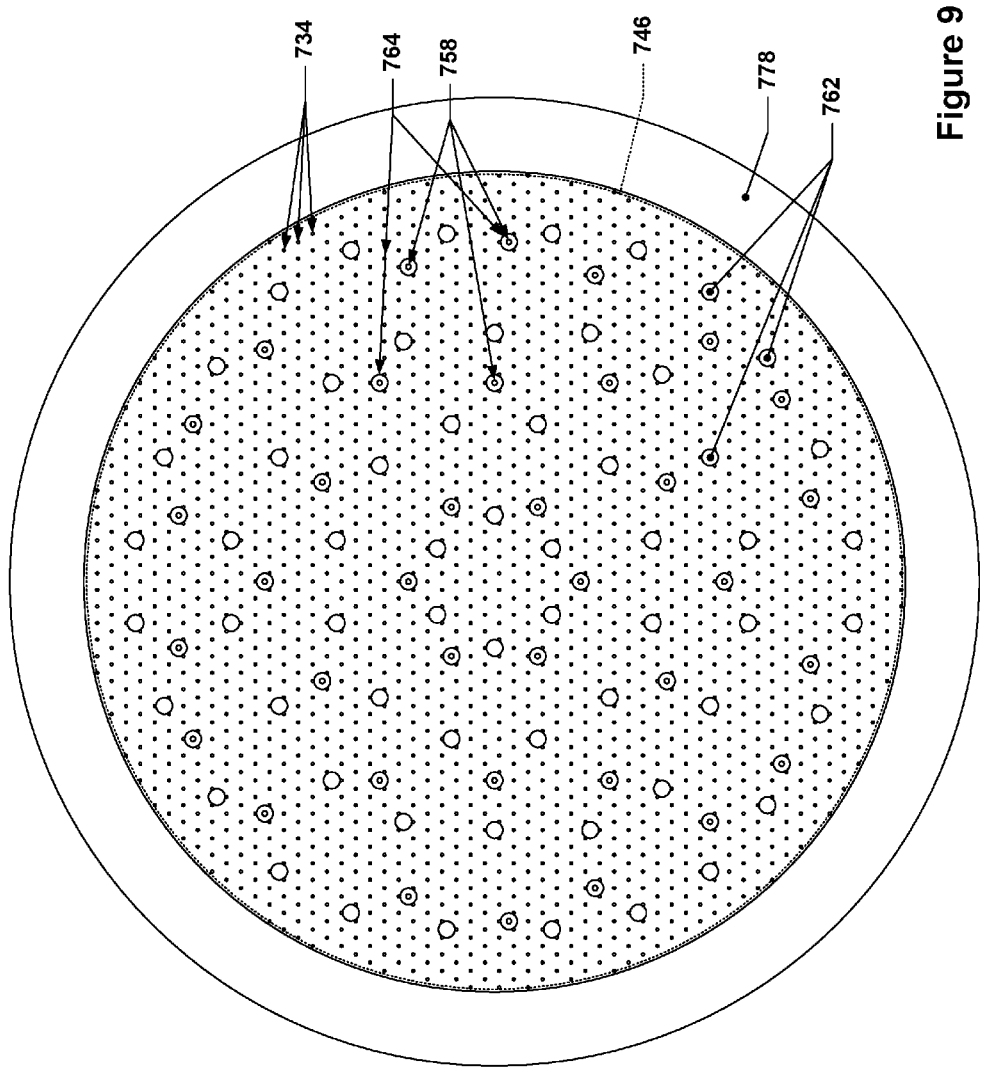
FIG. 9 depicts a plan view of a baffle plate of the example anti-transient, dual-plenum showerhead of FIG. 7.

FIG. 9 depicts a plan view of the baffle plate of the example anti-transient, dual-plenum showerhead of FIG. 7. In this implementation, the baffle plate 778 is very similar to the faceplate 104, except that the first support columns 764 are more numerous and are arranged differently from the first support columns 164. As can be seen from FIG. 7, each first support column 764 corresponds in location to one of the second holes 758 in the first partition plate 708, and the corresponding second hole 758 continues through the first support column 764. Thus, the first support columns 764 not only provide structural support and a thermally conductive pathway between the first partition plate 708 and the baffle plate 778, but also provide an avenue for gas flow through the baffle plate that keeps such gas isolated from the gas that is within the first gas distribution plenum volume 746. As with the faceplate 104, the baffle plate 778 may include a plurality of first raised bosses 760 that are each positioned beneath a first hole 756 (shown later) that fluidically connects one of the first gas flow passages 738 with the first gas distribution plenum volume 746. As with the faceplate 104, the baffle plate 778 may include a plurality of first gas distribution ports 734 that may supply gas from the first gas distribution plenum volume 746 to either the second gas distribution plenum volume immediately beneath the first gas distribution plenum or to a wafer processing area beneath the showerhead 700.

Figure 10:
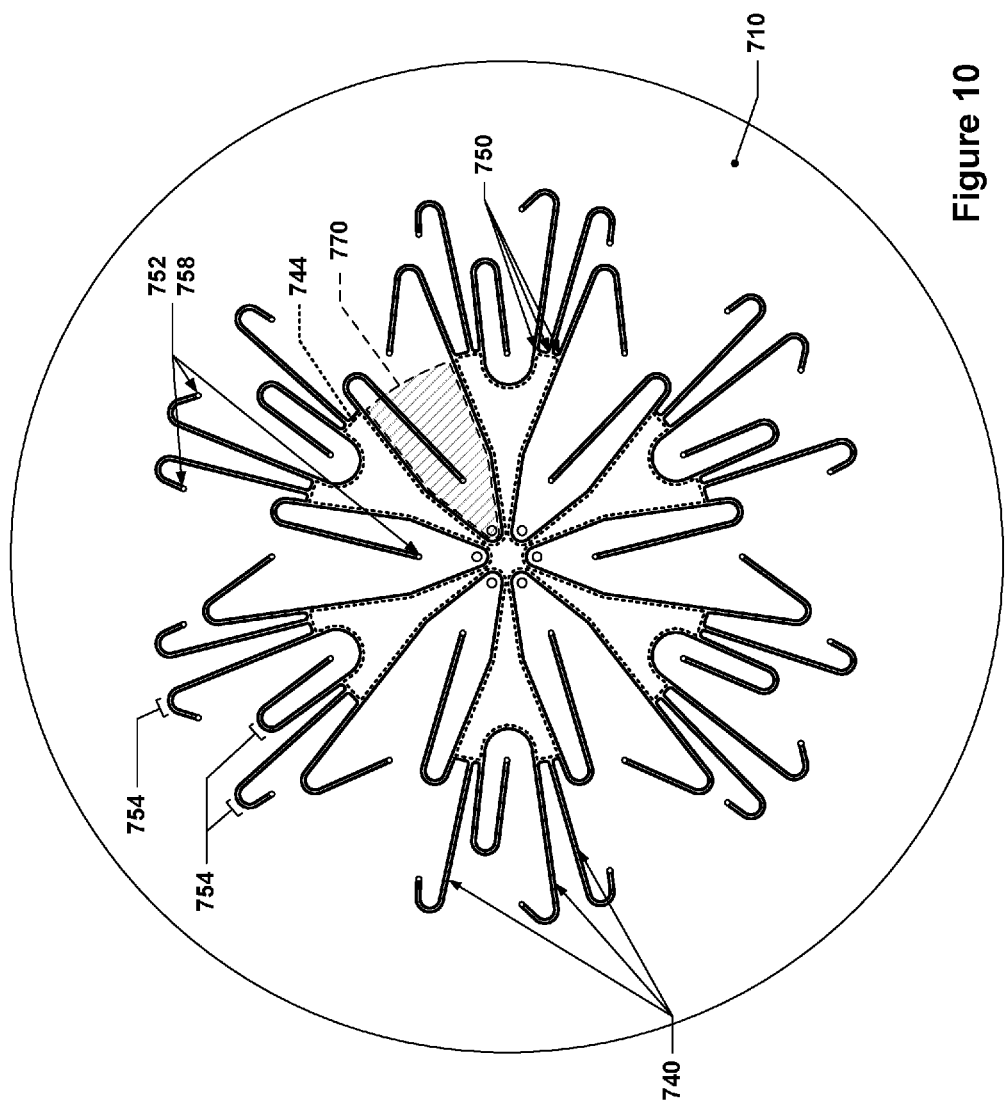
FIG. 10 depicts a plan view of a second partition plate of the example anti-transient, dual-plenum showerhead of FIG. 7.

FIG. 10 depicts a plan view of the second partition plate of the example anti-transient, dual-plenum showerhead of FIG. 7. The second partition plate 710 may serve a function similar to the first partition plate 708, but with respect to the second gas inlet 714. As can be seen, a plurality of substantially equal-length second gas flow passages 740 fluidly connects a second inlet plenum volume 744 with a second gas distribution plenum volume 748 (see FIG. 11) via second holes 758; the second gas distribution plenum volume 748, in this example, is a plenum volume formed between the baffle plate 778 and the faceplate 704. The second gas flow passages 740, in this case, and as with the first gas flow passages 738, may have first ends 750 that connect with the second inlet plenum volume 744 and second ends 752 that are fluidically connected with the second holes 758. As can be seen, each second gas flow passage 740 may also include a bend 754 which may be similar to the bends 754 in the first gas flow passages 738, although, as can be seen, the bend angles may be more relaxed. Similar to the first peninsulas 768 in the first inlet plenum volume 742, the second inlet plenum volume 744 may also include a plurality of second peninsulas 770 that allow some of the second holes 758 to be located within the outer periphery of the second inlet plenum volume 744.

Figure 11:
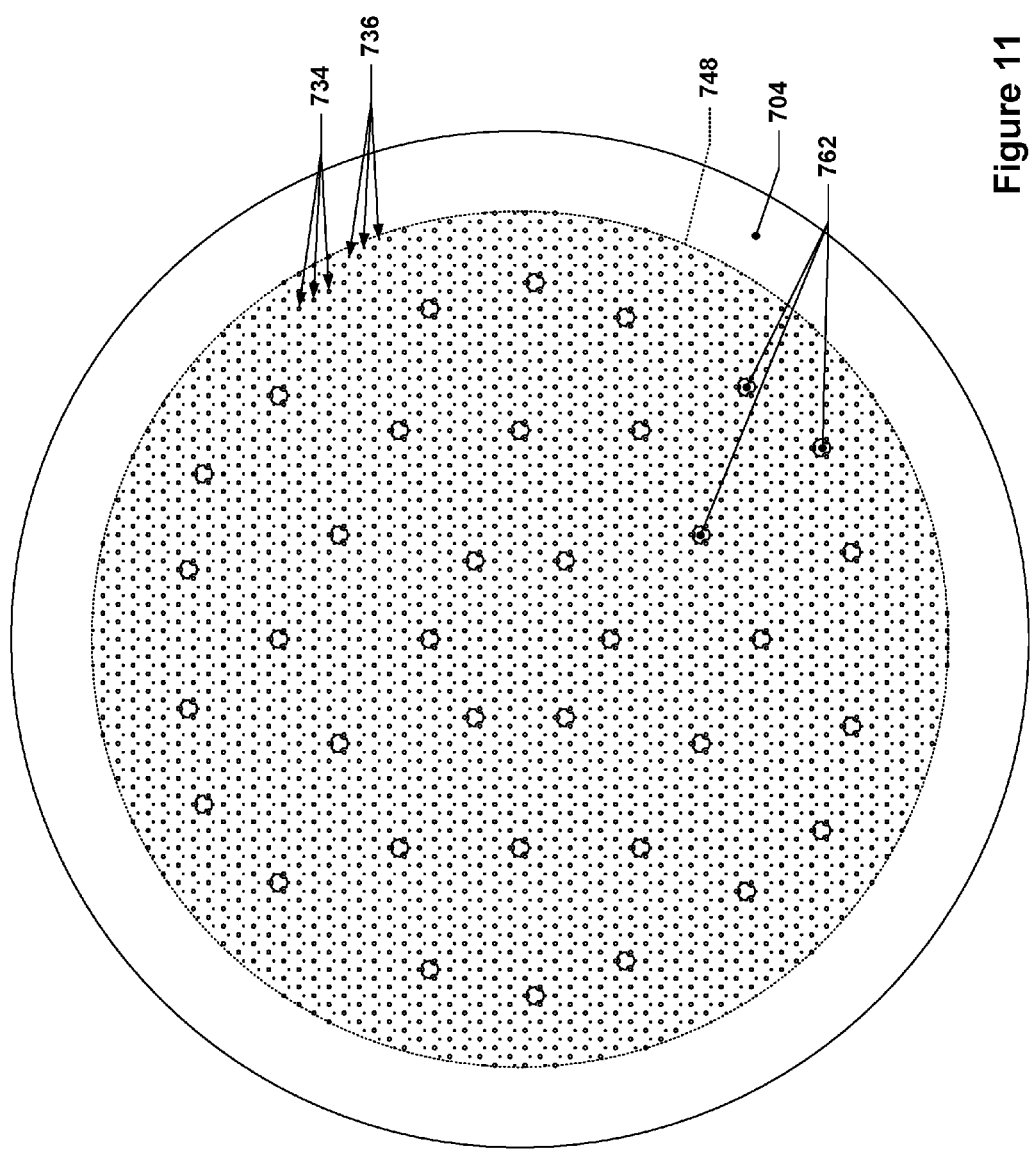
FIG. 11 depicts a plan view of a faceplate of the example anti-transient, dual-plenum showerhead of FIG. 7.

FIG. 11 depicts a plan view of the faceplate of the example anti-transient, dual-plenum showerhead of FIG. 7. The faceplate 704 may include a plurality of second gas distribution ports 736 and a plurality of first gas distribution ports 734. The second gas distribution plenum volume 748 may be formed between the faceplate 704 and the baffle plate 77, and may include a pattern of second raised bosses 762 that serve as mini-baffles for the second holes 758, much as the first raised bosses 760 do for the first holes 756.

In some implementations, each first gas distribution port 734 in the baffle plate 778 may be fluidically connected to the corresponding first gas distribution port 734 in the faceplate 704 by a tubular structure 784 that isolates the gas flowing through the first gas distribution ports 734 from the gas flowing through the second gas distribution plenum volume 748 within the showerhead 700.

Figure 12:
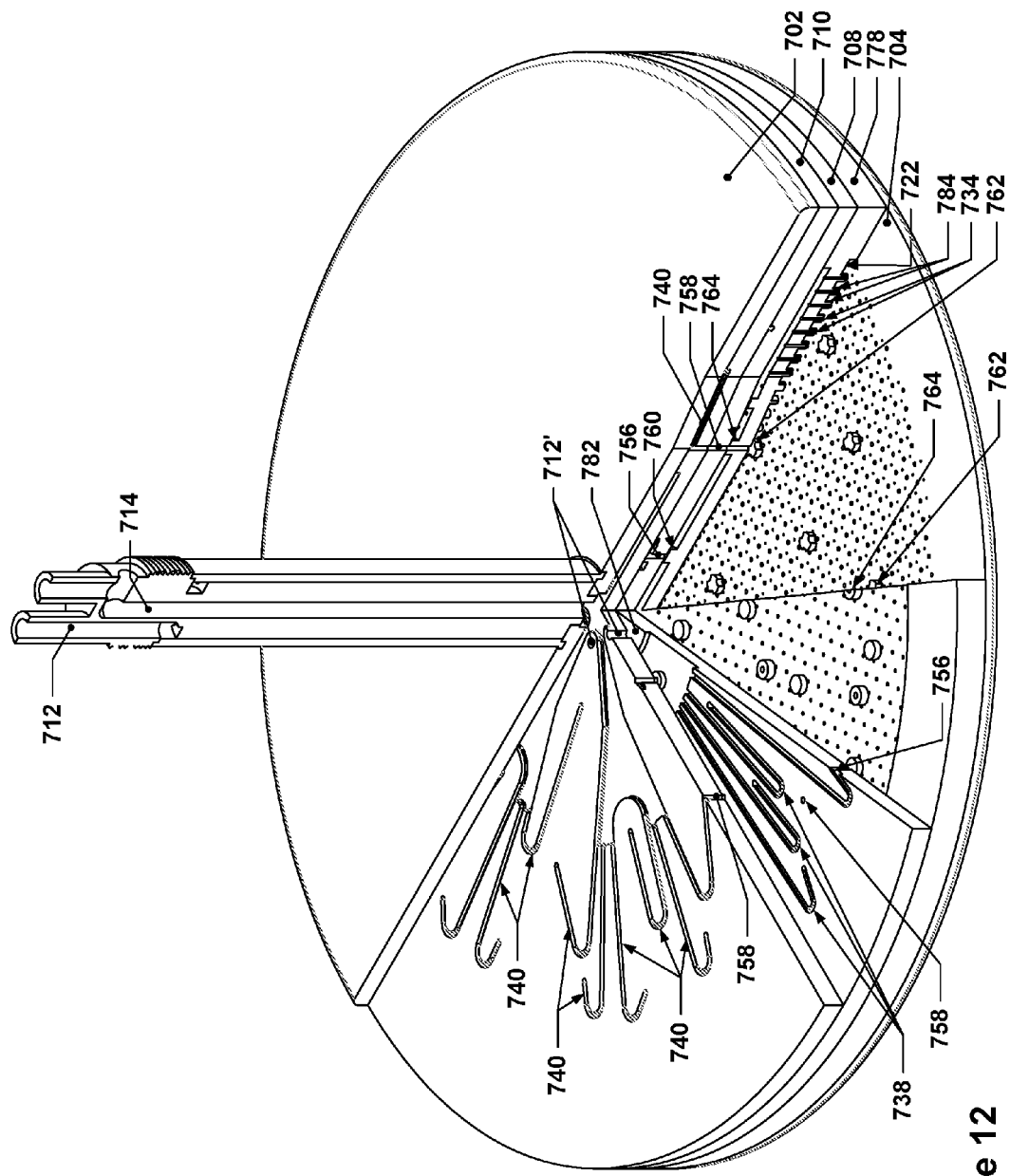
FIG. 12 depicts an isometric cutaway view of the example anti-transient, dual-plenum showerhead of FIG. 7.

FIG. 12 depicts an isometric cutaway view of the example anti-transient, dual-plenum showerhead of FIG. 7, and may provide more insight into the structure of the showerhead 700.

Similar to the first inlet plenum volume 742 and the first gas distribution plenum volume 746, the second inlet plenum volume 744 and the second gas distribution plenum volume 748 may also be bounded by various surfaces. These surfaces are indicated in FIG. 7. For example, the second inlet plenum volume 744 may be bounded, in part, by a fifth surface 724 and a seventh surface 728, whereas the second gas distribution plenum volume 748 may be bounded, in part, by a sixth surface 726 and an eighth surface 730.

In multi-plenum showerheads, the positioning of the inlet plenums with respect to the gas distribution plenums may be re-ordered as needed for any particular design—they need not be in the arrangement depicted. For example, in the depicted implementations, the first inlet plenum volume and the first gas distribution plenum volume are bracketed between the second inlet plenum volume and the second gas distribution plenum volume. In other implementations, however, this ordering may be altered. By way of non-limiting example, any of the following orders may also be used in various implementations of this concept:

| Implementation 1 | Implementation 2 | Implementation 3 | Implementation 4 |
|---|---|---|---|
| First inlet plenum volume | Second inlet plenum volume | First inlet plenum volume | Second inlet plenum volume |
| Second inlet plenum volume | First inlet plenum volume | Second inlet plenum volume | First inlet plenum volume |
| Second gas distribution plenum volume | Second gas distribution plenum volume | Second gas distribution plenum volume | First gas distribution plenum volume |
| First gas distribution plenum volume | First gas distribution plenum volume | First gas distribution plenum volume | Second gas distribution plenum volume |

In such cases, plenum volumes for a first gas that have plenum volumes for a second gas interposed between them may be fluidically connected by causing the holes, e.g., the first holes, that fluidically connect the plenums for the first gas to pass between the gas flow passages for the second gas or through support columns within the plenum(s) for the second gas.

What is claimed is:

1. An apparatus comprising:
   a first gas inlet;
   a first surface, wherein the first gas inlet is configured to deliver a first process gas through the first surface;
   a plurality of first gas distribution ports;
   a second surface, wherein the plurality of first gas distribution ports are configured to deliver the first process gas through the second surface;
   a third surface interposed between the first surface and the second surface;
   a fourth surface interposed between the third surface and the second surface; a plurality of first raised bosses that extend up from the second surface towards the fourth surface;
   a plurality of first gas flow passages interposed between the first surface and the third surface; and
   a plurality of first holes passing through the fourth surface, wherein:
   the first surface and the third surface at least partially define a first inlet plenum volume that is fluidically connected with the first gas inlet,
   the second surface and the fourth surface at least partially define a first gas distribution plenum volume that is fluidically connected with each first gas distribution port of the plurality of first gas distribution ports,
   each first gas flow passage of the plurality of first gas flow passages has a corresponding first end that fluidically connects with the first inlet plenum volume and a corresponding second end that fluidically connects with the first gas distribution plenum volume via a corresponding first hole of the plurality of first holes,
   each first raised boss of the plurality of first raised bosses is centered on a corresponding first hole of the plurality of first holes and has a corresponding top surface facing the fourth surface that is offset from the fourth surface by a corresponding first distance, and
   each first gas flow passage of the plurality of first gas flow passages is substantially the same length, extends away from the first inlet plenum volume at the corresponding first end, and includes between 140° and 200° of bends between the corresponding first end and the corresponding second end such that the corresponding second end is oriented towards the first inlet plenum volume.

2. The apparatus of claim 1, wherein each first raised boss of the plurality of first raised bosses has a corresponding nominal diameter and a corresponding first distance between $\frac{1}{11}^{th}$ and $\frac{1}{13}^{th}$ of the corresponding nominal diameter.

3. The apparatus of claim 1, wherein different subsets of first gas distribution ports of the plurality of first gas distribution ports are adjacent to each first raised boss of the plurality of first raised bosses and each first raised boss of the plurality of first raised bosses is centered between the first gas distribution ports of a corresponding subset of the different subsets of the first gas distribution ports of the plurality of first gas distribution ports.

4. The apparatus of claim 1, further comprising a plurality of first support columns, wherein each first support column of the plurality of first support columns spans between the second surface and the fourth surface.

5. The apparatus of claim 1, wherein each first hole of the plurality of first holes has a diameter of between 1.5 mm and 3 mm and wherein each first raised boss of the plurality of first raised bosses has a diameter of between 5 mm and 8 mm.

6. The apparatus of claim 1, further comprising a plurality of first peninsulas, wherein:
   the first inlet plenum volume has a first center point,
   each first peninsula of the plurality of first peninsulas protrudes into the first inlet plenum volume, and
   the corresponding second end of one or more of the first gas flow passages of the plurality of first gas flow passages extends into
   a corresponding first peninsula of the plurality of first peninsulas and
   is closer to the first center point than the corresponding first end of the corresponding first gas flow passage of the plurality of first gas flow passages.

7. The apparatus of claim 1, wherein each first gas flow passage of the plurality of first gas flow passages includes between 150° and 190° of bends between the corresponding first end and the corresponding second end.

8. The apparatus of claim 1, wherein each first gas flow passage of the plurality of first gas flow passages has a length within ±30% of the other first gas flow passages.

9. The apparatus of claim 1, wherein the cross-sectional area of each first gas flow passage of the plurality of first gas flow passages along the length of the corresponding first gas flow passage of the plurality of first gas flow passages is constant.

10. The apparatus of claim 1, wherein the corresponding first end of each first gas flow passage of the plurality of first gas flow passages is equidistant from a first axis of the apparatus.

11. The apparatus of claim 1, wherein there are between 20 and 100 first gas flow passages in the plurality of first gas flow passages.

12. The apparatus of claim 1, further comprising:
    a second gas inlet;
    a fifth surface, wherein the second gas inlet is configured to deliver a second process gas through the fifth surface;
    a plurality of second gas distribution ports;
    a sixth surface, wherein the plurality of second gas distribution ports are configured to deliver the second process gas through the sixth surface;
    a seventh surface interposed between the fifth surface and the sixth surface;
    an eighth surface interposed between the sixth surface and the seventh surface;
    a plurality of second gas flow passages interposed between the fifth surface and the seventh surface; and
    a plurality of second holes passing through the eighth surface, wherein:
        the fifth surface and the seventh surface at least partially define a second inlet plenum volume that is fluidically connected with the second gas inlet,
        the sixth surface and the eighth surface at least partially define a second gas distribution plenum volume that is fluidically connected with each second gas distribution port of the plurality of second gas distribution ports,
        each second gas flow passage of the plurality of second gas flow passages has a corresponding first end that fluidically connects with the second inlet plenum volume and a corresponding second end that fluidically connects with the second gas distribution plenum volume via a corresponding second hole of the plurality of second holes, and
        each second gas flow passage of the plurality of second gas flow passages is substantially the same length, extends away from the second inlet plenum volume at the corresponding first end, and includes between 140° and 200° of bends between the corresponding first end and the corresponding second end such that the corresponding second end is oriented towards the second inlet plenum volume.

13. The apparatus of claim 12, wherein:
    a plurality of second raised bosses
    extends up from the sixth surface towards the eighth surface,
    each second raised boss of the plurality of second raised bosses is centered on a corresponding second hole of the plurality of second holes, and
    each second raised boss of the plurality of second raised bosses has a corresponding top surface facing the eighth surface that is offset from the eighth surface by a second distance.

14. The apparatus of claim 12, wherein the first gas inlet includes a plurality of ports and the first inlet plenum volume is partitioned into multiple first inlet plenum sub-volumes, each first inlet plenum sub-volume of the multiple first inlet plenum sub-volumes associated with a different port of the plurality of ports.

15. The apparatus of claim 12, wherein the first inlet plenum volume, the second inlet plenum volume, the first gas distribution plenum volume, and the second gas distribution plenum volume are arranged in a stacked configuration and in an order selected from the group consisting of:
    (i) second inlet plenum volume, first inlet plenum volume, first gas distribution plenum volume, and second gas distribution plenum volume;
    (ii) second inlet plenum volume, first inlet plenum volume, second gas distribution plenum volume, and first gas distribution plenum volume;
    (iii) second inlet plenum volume, first gas distribution plenum volume, first inlet plenum volume, and second gas distribution plenum volume; (iv) first inlet plenum volume, second inlet plenum volume, first gas distribution plenum volume, and second gas distribution plenum volume; and
    (v) first inlet plenum volume, second inlet plenum volume, second gas distribution plenum volume, and first gas distribution plenum volume.

16. The apparatus of claim 13, wherein different subsets of first gas distribution ports of the plurality of first gas distribution ports are adjacent to each first raised boss of the plurality of the plurality of the first raised bosses and each first raised boss of the plurality of first raised bosses is centered between the first gas distribution ports of a corresponding subset of the different subsets of the first gas distribution ports of the plurality of first gas distribution ports.

17. The apparatus of claim 13, wherein different subsets of second gas distribution ports of the plurality of second gas distribution ports are adjacent to each second raised boss of the plurality of second raised bosses and each second raised boss of the plurality of second raised bosses is centered between the second gas distribution ports of a corresponding subset of the different subsets of the second gas distribution ports of the plurality of second gas distribution ports.

18. The apparatus of claim 12, further comprising a plurality of first support columns and a plurality of second support columns, wherein:

each first support column of the plurality of first support columns spans between the second surface and the fourth surface, and each second support column of the plurality of second support columns spans between the sixth surface and the eighth surface.

19. The apparatus of claim 12, further comprising a plurality of first peninsulas, wherein:

the first inlet plenum volume has a first center point, each first peninsula of the plurality of first peninsulas protrudes into the first inlet plenum volume, and the corresponding second end of one or more of the first gas flow passages of the plurality of first gas flow passages extends into a corresponding first peninsula of the plurality of first peninsulas and is closer to the first center point than the corresponding first end of the corresponding first gas flow passage of the plurality of first gas flow passages.

20. The apparatus of claim 12, further comprising a plurality of second peninsulas, wherein:

the second inlet plenum volume has a second center point, each second peninsula of the plurality of second peninsulas protrudes into the second inlet plenum volume, the corresponding second end of one or more of the second gas flow passages of the plurality of second gas flow passages extends into a corresponding second peninsula of the plurality of second peninsulas and is closer to the second center point than the corresponding first end of the corresponding second gas flow passage of the plurality of second gas flow passages.

21. The apparatus of claim 1, wherein each of the corresponding first distances is between 0.025 mm and 1.2 mm for the corresponding first raised boss of the plurality of first raised bosses.

22. The apparatus of claim 1, wherein:

each first hole has a hole diameter, and each of the corresponding first distances is less than twice a difference between a nominal boss diameter for the corresponding first raised boss of the plurality of first raised bosses and the corresponding hole diameter and is greater than 0.2 times the difference between the nominal boss diameter for the corresponding first raised boss of the plurality of first raised bosses and the corresponding hole diameter.

23. The apparatus of claim 1, wherein the first raised bosses of the plurality of first raised bosses each have a nominal diameter of between 5 mm and 8 mm.

24. The apparatus of claim 1, wherein the length of each first gas flow passage of the plurality of first gas flow passages is within ±5% of the lengths of the other first gas flow passages in the plurality of first gas flow passages.

25. The apparatus of claim 1, wherein the length of each first gas flow passage of the plurality of first gas flow passages is within ±10% of the lengths of the other first gas flow passages in the plurality of first gas flow passages.

26. The apparatus of claim 1, wherein the length of each first gas flow passage of the plurality of first gas flow passages is within ±20% of the lengths of the other first gas flow passages in the plurality of first gas flow passages.

* * * * *